(12) United States Patent
Kunikiyo

(10) Patent No.: US 6,429,505 B1
(45) Date of Patent: Aug. 6, 2002

(54) SOI SEMICONDUCTOR CONTROLLED RECTIFIER AND DIODE FOR ELECTROSTATIC DISCHARGE PROTECTION

(75) Inventor: Tatsuya Kunikiyo, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/755,139

(22) Filed: Jan. 8, 2001

(30) Foreign Application Priority Data

Aug. 8, 2000 (JP) ........................................ 2000-239405

(51) Int. Cl.$^7$ .............................................. H01L 29/70
(52) U.S. Cl. ........................ 257/577; 257/360; 257/361
(58) Field of Search ................................ 257/360, 358, 257/350, 577; 438/151

(56) References Cited

U.S. PATENT DOCUMENTS

| 5,610,425 | A | * | 3/1997 | Quigley et al. ............. 257/358 |
| 5,959,332 | A | * | 9/1999 | Ravanelli et al. ........... 257/360 |
| 6,015,992 | A | | 1/2000 | Chatterjee et al. .......... 257/350 |
| 6,037,397 | A | | 3/2000 | Voldman ..................... 257/335 |
| 6,080,612 | A | | 6/2000 | Hsu ........................... 438/202 |
| 6,096,584 | A | * | 8/2000 | Ellis-Monaghan et al. .. 438/151 |

FOREIGN PATENT DOCUMENTS

| JP | 10-189879 | 7/1998 |
| JP | 11-330439 | 11/1999 |

* cited by examiner

*Primary Examiner*—David Nelms
*Assistant Examiner*—Tu-Tu Ho
(74) *Attorney, Agent, or Firm*—Oblon, Spivak, McClelland, Maier & Neustadt, P.C.

(57) ABSTRACT

A diode (QN1) is connected in parallel to one of two bipolar transistors (PB1, NB1) constituting a semiconductor-controlled rectifier or SCR (400) in such a direction as to encourage positive feedback. This enhances current drivability and accelerates a turn-on operation.

13 Claims, 36 Drawing Sheets

F I G. 4
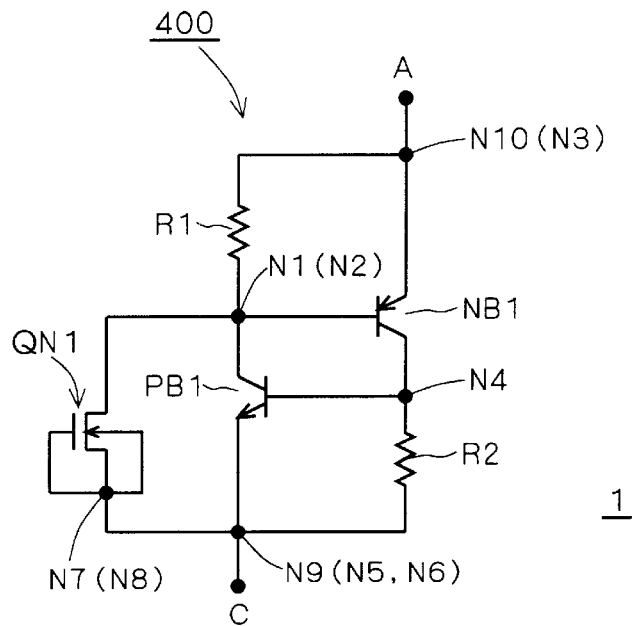
F I G. 5
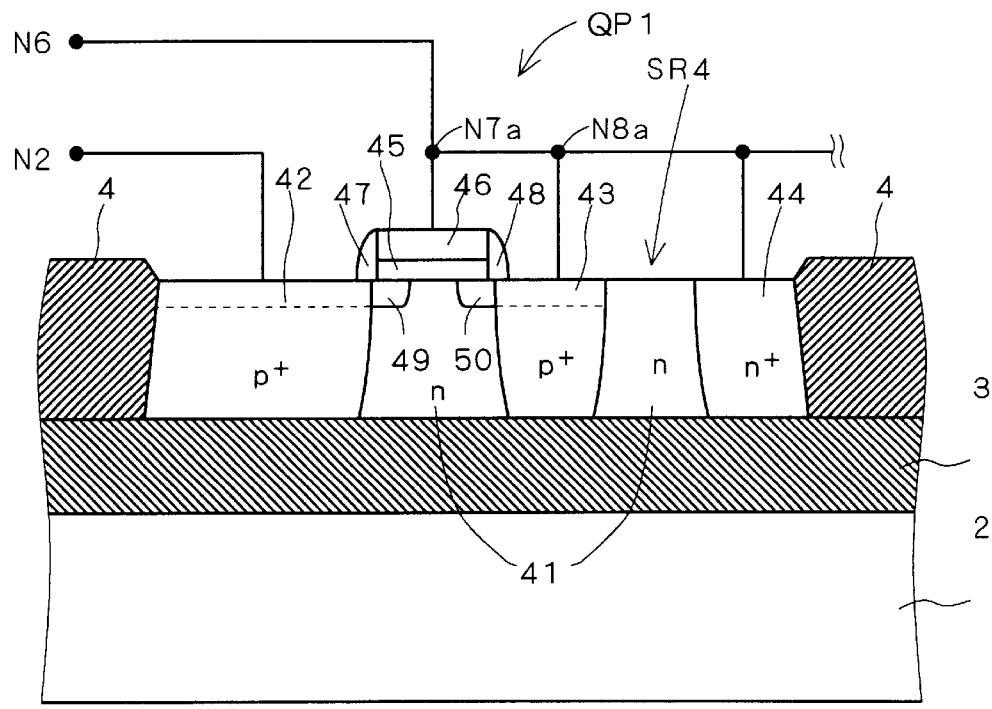

F I G. 6
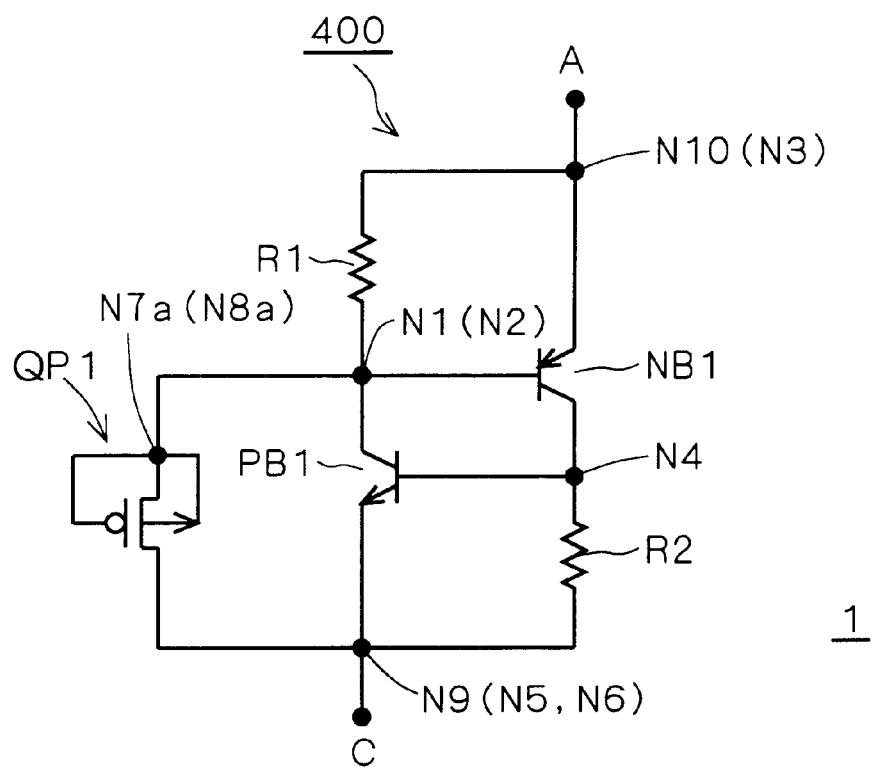

F/G. 24

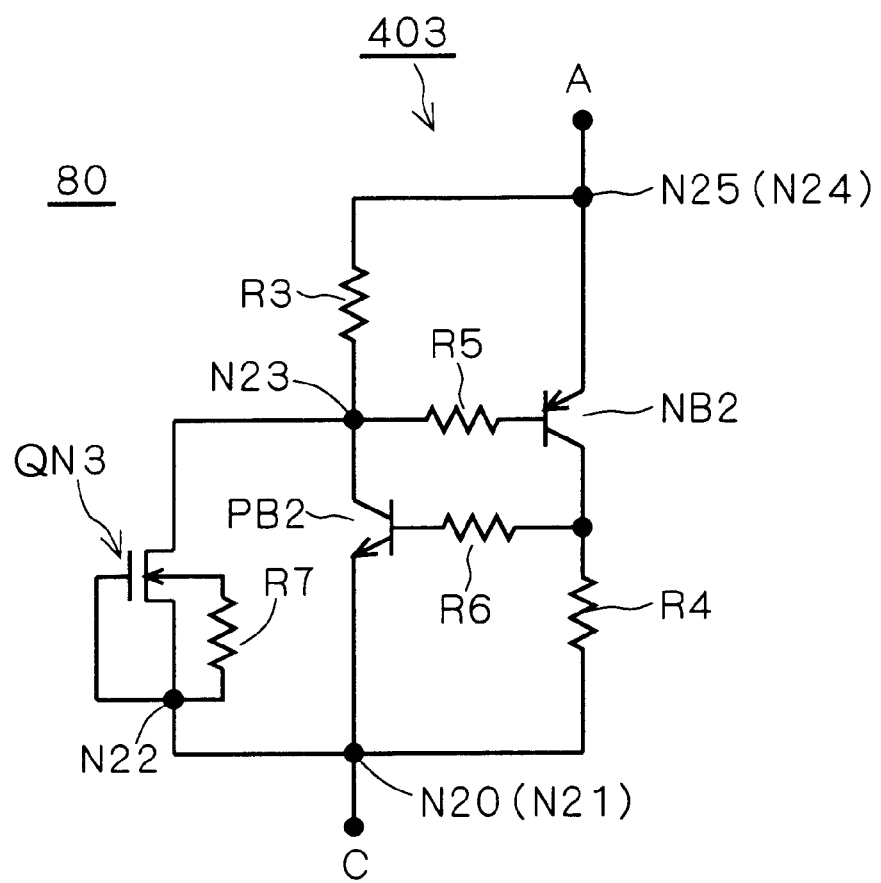
F I G. 30

F I G. 36
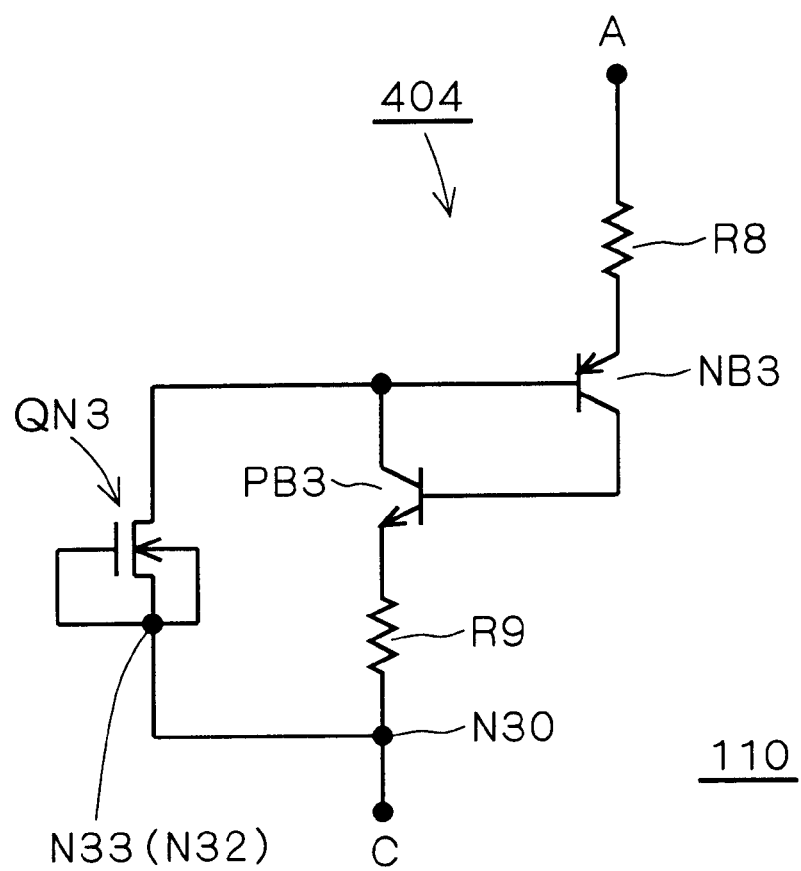

SOI SEMICONDUCTOR CONTROLLED RECTIFIER AND DIODE FOR ELECTROSTATIC DISCHARGE PROTECTION

BACKGROUND OF THE INVENTION

1. Field of the Invention

The present invention relates to a semiconductor device suitable for use as a protection circuit for protecting an integrated circuit against electrostatic discharge (ESD), and in particular to improvements for the purposes of enhancing current drivability and accelerating a turn-on operation.

2. Description of the Background Art

Conventionally, ESD protection circuits have been utilized for preventing integrated circuits formed in semiconductor substrates from being damaged by the application of a positive or negative high voltage, as overshooting or undershooting input voltage, due to the accumulation of electrostatic charge in the human body or machinery. Semiconductor controlled rectifiers (generally referred to as "SCRs") are a kind of such ESD protection circuits.

FIGS. 42 and 43 are a cross-sectional view and a circuit diagram of a conventional SCR, respectively. This SCR 200 is formed in an SOI substrate including a supporting substrate 201, a buried insulation film 202, and an SOI (semiconductor on insulator) layer 203 and is utilized as a protection circuit for protecting an internal circuit 212, which is an integrated circuit being protected, against ESD. In the main surface of the SOI layer 203, STI (shallow trench isolation) as a partial isolating layer 204 which does not reach the buried insulation film 202 is selectively formed, by which a plurality of element regions SR100, SR101, and SR102 are partially isolated from each other.

The SOI layer 203 includes a p layer 205 which is adjacent to the buried insulation film 202. In the element region SR100 of the SOI layer 203, an n layer 206 is selectively formed in the main surface, and an $n^+$ layer 207, a $p^+$ layer 208, and an $n^+$ layer 209 are also selectively formed in the main surface to cover the surface of the p layer 205. In the element region SR101, an $n^+$ layer 210 is formed in the main surface. In the element region SR102, a $p^+$ layer 211 is formed in the main surface.

The $p^+$ layer 208, the n layer 206, and the p layer 205 form the collector, base, and emitter of a pnp bipolar transistor NB100, respectively, while the n layer 206, the p layer 205, and the $n^+$ layer 210 form the collector, base, and emitter of an npn bipolar transistor PB100, respectively. Further, the $p^+$ layer 208 forms a resistive element R100 while the $n^+$ layer 210 forms a resistive element R101.

In this fashion, the SCR 200 comprises the two bipolar transistors NB100 and PB100 of different conductivity types, the collector of one transistor being connected to the base of the other transistor and the base of one transistor being connected to the collector of the other transistor. The bipolar transistors NB100 and PB100 thus constitute a positive feedback circuit.

The $n^+$ layer 207 and the $p^+$ layer 208 are connected through a node (a connection in the wiring) N100 to an anode A, and the $n^+$ layer 210 and the $p^+$ layer 211 are connected through a node N101 to a cathode C. The anode A is connected to a wire 213 for use in transmission of an input signal T1 to the internal circuit 212.

FIG. 44 is a graph schematically showing the current-voltage characteristics of the SCR 200. When the anode-cathode voltage (the potential of the anode A relative to the cathode C) $V_{AC}$ rises from 0 in a positive direction, the SCR 200 is kept in a high impedance state where the current $I_1$ hardly flows, until the voltage $V_{AC}$ reaches a switching voltage $V_S$. However, when the voltage $V_{AC}$ exceeds the switching voltage $V_S$, the SCR 200 quickly transits to a low impedance state where a large current flows. The SCR 200 will be kept in this low impedance state until the current $I_1$ flowing through the SCR 200 falls beneath a holding current $I_H$.

Thus, when ESD causes the voltage of the input signal T1 (FIG. 42) to overshoot the source voltage $V_{DD}$ to $V_{DD}+\Delta V_{DD}$, the anode-cathode voltage $V_{AC}$ of the SCR 200 exceeds the switching voltage $V_S$ before the internal circuit 212 is broken and thus the SCR 200 transits from the high impedance state to the low impedance state. Then, current larger than the holding current $I_H$ flows through the SCR 200 and the voltage of the input signal $T_1$ decreases before the overshoot voltage $V_{DD}+\Delta V_{DD}$ is transmitted to the internal circuit 212.

A surge voltage caused by ESD is high but its amount of charge is limited; therefore, the current flowing through the SCR 200 will fall beneath the holding voltage $I_H$ in due course. As a result, the SCR 200 returns back to its initial or high impedance state from the low impedance state. In this way, the SCR 200 protects the internal circuit 212 against damage from ESD.

U.S. Pat. No. 6,015,992 discloses an SCR which comprises MOSFETs (MOS field-effects transistors) formed in an SOI substrate. FIG. 45 is a perspective view of the SCR disclosed in this U.S. Patent when viewed angularly from the above, and FIG. 46 is a cross-sectional view of this SCR 300 of FIG. 45, taken along the section line Z1–Z2. FIG. 47 is a circuit diagram of the SCR 300 of FIG. 45.

The SCR 300 is also formed in an SOI substrate including a supporting substrate 301, a buried insulation film 302, and an SOI layer 350. In the main surface of the SOI layer 350, STI as a full isolating layer 303 which reaches the buried insulation film 302 is selectively formed, by which a plurality of element regions SR200, SR201, SR202, and SR203 are fully isolated from each other.

In the element region SR200, $p^+$ layers 308, 309 and a p layer 304 are formed. The p layer 304 forms a resistive element R200. In the element region SR203, $n^+$ layers 316, 317 and an n layer 307 are formed. The n layer 307 forms a resistive element 210.

In the element region SR201, a p layer 305, n layers 318, 319, $n^+$ layers 310, 311, and a $p^+$ layer 312 are formed. The n layer 318 and the $n^+$ layer 310 form the source of an n-channel MOSFET, and the n layer 319 and the $n^+$ layer 311 form the drain thereof. In particular, the n layers 318 and 319 make extensions which are parts of the source/drain (herein a pair of source and drain is generically referred to as a "source/drain").

Part of the p layer 305 is opposed to a gate 323 with a gate insulating film 322 therebetween. Further, sidewalls or insulators 324, 325 are formed on the side surfaces of the gate 323. The p layer 305 and the $p^+$ layer 312 form the body of the n-channel MOSFET. Especially, a portion of the p layer 305 of the body which is sandwiched between the source/drain 310, 318, 311 and 319 and is opposed to the gate 323 functions as a channel. Also, the $p^+$ layer 312 of the body where connections with wiring are made is called a body contact region.

The $n^+$ layer 310, the p layer 305 (and the $p^+$ layer 312), and the $n^+$ layer 311 form the emitter, base, and collector of an npn bipolar transistor PB200, respectively. That is, the element region SR201 has formed therein the bipolar transistor PB200 as a parasitic bipolar transistor of the n-channel MOSFET.

The element region SR202 is formed to be symmetrical to the element region SR201 with respect to the conductivity type. More specifically, an n layer 306, p layers 320, 321, p$^+$ layers 313, 314, and an n$^+$ layer 315 are formed in the element region SR202. The p layer 320 and the p$^+$ layer 313 form the drain of a p-channel MOSFET, and the p layer 321 and the p$^+$ layer 314 form the source thereof. In particular, the p layers 320 and 321 make extensions which are parts of the source/drain.

Part of the n layer 306 is opposed to a gate 327 with a gate insulating film 326 therebetween. Further, sidewalls or insulators 328, 329 are formed on the side surfaces of the gate 327. The n layer 306 and the n$^+$ layer 315 form the body of the p-channel MOSFET. Especially, a portion of the n layer 306 of the body which is sandwiched between the source/drain 313, 320, 314, and 320 and is opposed to the gate 327 functions as a channel. Also, the n$^+$ layer 315 of the body where a connection with wiring is made corresponds to a body contact region.

The p$^+$ layer 313, the n layer 306 (and the n$^+$ layer 315), and the p$^+$ layer 314 form the collector, base, and emitter of a pnp bipolar transistor NB200, respectively. That is, the element region SR202 has formed therein the bipolar transistor NB200 as a parasitic bipolar transistor of the p-channel MOSFET.

The base and collector of the bipolar transistor PB200 are individually connected to the collector and base of the bipolar transistor NB200 through the wiring. The bipolar transistors NB200 and PB200 thus constitute a positive feedback circuit. In FIGS. 45 to 47, nodes N201 to N205 represent connections in the wiring.

The emitter and base of the bipolar transistor PB200 are connected with each other through the wiring, and the emitter and base of the bipolar transistor NB200 are also connected with each other through the wiring. This is equivalent to the condition that the p layer 305 as the body of the n-channel MOSFET is fixed to the n$^+$ layer 310 as the source thereof and the n layer 306 as the body of the p-channel MOSFET is fixed to the p$^+$ layer 314 as the source thereof.

Further, the gate 323 is connected through the wiring to the n$^+$ layer 310 as the source, while the gate 327 is connected through the wiring to the p$^+$ layer 314 as the source. One end of the resistive element R200 is connected through the wiring to the anode A, while one end of the resistive element R210 is connected through the wiring to the cathode C.

With such a construction, the SCR 300, like the SCR 200, can be utilized as a protection circuit for protecting an internal circuit against damage from ESD.

Now, the SCR used as a protection circuit is required to have the function of transiting to the low impedance state by being turned on before the voltage of the input signal T1 rises, thereby to absorb the current and change the voltage of the input signal T1 (FIG. 42), which travels through the wiring, back to normal. From this, the SCR should preferably have a high operating speed.

In the SCR 200, however, the current flows laterally (i.e., in a direction along the main surface of the substrate) through the bipolar transistor PB100 formed in the SOI substrate. Therefore, a limitation to the thickness of the SOI layer 203 or the thickness of a portion of the SOI layer 203 directly below the partial isolating layer 204 (i.e., a portion of the SOI layer 203 sandwiched between the partial isolating layer 204 and the buried insulation film 202) causes problems of low current drivability and a delay in turn-on operation.

Similarly in the SCR 300, the current flows laterally through the bipolar transistors PB200 and NB200 formed in the SOI substrate. Thus, the limited thickness of the SOI layer 350 causes problems of low current drivability and a delay in turn-on operation.

SUMMARY OF THE INVENTION

An object of the present invention is to provide a semiconductor device capable of enhancing current drivability and accelerating the turn-on operation.

A first aspect of the present invention is directed to a semiconductor device comprising: a semiconductor controlled rectifier having two bipolar transistors of different conductivity types, one of the two bipolar transistors having its base and collector connected respectively to a collector and a base of the other of the two bipolar transistors; and a diode connected inversely in parallel to the collector and emitter of the one bipolar transistor.

According to a second aspect of the present invention, the semiconductor device of the first aspect further comprises two resistive elements, wherein the two bipolar transistors each have its base and emitter connected with each other through one of the two resistive elements.

According to a third aspect of the present invention, in the semiconductor device of the second aspect, the two bipolar transistors, the two resistive elements, and the diode are formed in an SOI layer of an SOI substrate.

According to a fourth aspect of the present invention, in the semiconductor device of the third aspect, a partial isolating layer is selectively formed in a main surface of the SOI layer, and the two resistive elements are formed in portions of the SOI layer sandwiched between the partial isolating layer and a buried insulation film.

According to a fifth aspect of the present invention, the semiconductor device of the fourth aspect further comprises other two resistive elements formed in other portions of the SOI layer sandwiched between the partial isolating layer and the buried insulation film, wherein one of the other two resistive elements is interposed between the base of the other bipolar transistor and a connection between the collector of the one bipolar transistor and one of the two resistive elements, and the other of the other two resistive elements is interposed between the base of the one bipolar transistor and a connection between the collector of the other bipolar transistor and the other of the two resistive elements.

According to a sixth aspect of the present invention, in the semiconductor device of the fifth aspect, impurity concentration is higher in the other portions of the SOI layer than in the portions of the SOI layer so that resistance of the other two resistive elements is lower than that of the two resistive elements.

According to a seventh aspect of the present invention, in the semiconductor device of any of the first to sixth aspects, the two bipolar transistors each have its emitter being one of the source and drain of a MOSFET, its collector being the other of the source and drain of the MOSFET, and its base being the body of the MOSFET.

According to an eighth aspect of the present invention, in the semiconductor device of the seventh aspect, the two MOSFETs each have its gate connected to the source.

According to a ninth aspect of the present invention, in the semiconductor device of the eighth aspect, the two MOS- FETs each have a metal-semiconductor compound film which is formed across surfaces of its gate and source to establish a connection between the gate and the source.

According to a tenth aspect of the present invention, in the semiconductor device of the ninth aspect, in each of the two MOSFETs, the metal-semiconductor compound film is also formed across a surface of the body to establish connections for the gate, the source, and the body.

According to a eleventh aspect of the present invention, in the semiconductor device of any of the first to fourth aspects, the two bipolar transistors are formed of semiconductor layers, which are alternately jointed in an p-n-p-n order, to be equivalent in configuration.

According to a twelfth aspect of the present invention, in the semiconductor device of any of the first to eleventh aspects, the diode is a BCG (body coupled gate) diode or a MOSFET whose gate and body are connected to one side of the source and the drain.

According to a thirteenth aspect of the present invention, in the semiconductor device of the twelfth aspect, the BCG diode has a metal-semiconductor compound film which is formed across a surface of the one side and a surface of a portion of the body which is not covered with the gate, to establish a connection between the one side and the body.

According to a fourteenth aspect of the present invention, in the semiconductor device of the thirteenth aspect, in the BCG diode, the metal-semiconductor compound film is also formed across a surface of the gate to establish a connection to the gate.

In accordance with the device of the first aspect, the diode is connected inversely in parallel to the bipolar transistor constituting a semiconductor controlled rectifier. This encourages the positive feedback function of the semiconductor controlled rectifier, thereby enhancing current drivability and accelerating a turn-on operation. The device is thus suitable for use as a protection circuit, which can show high protection capability.

In accordance with the device of the second aspect, the two bipolar transistors each have its base and emitter connected with each other through a resistive element. The base potential can thus be fixed, which stabilizes the operation of the semiconductor controlled rectifier.

In accordance with the device of the third aspect, the two bipolar transistors, the two resistive elements, and the diode are formed in the SOI layer of the SOI substrate. It is thus readily possible to provide full isolation between each element. Although those elements are formed in the SOI layer, the diode, due to its positive-feedback encouraging function, enhances current drivability of the semiconductor controlled rectifier and accelerates the turn-on operation thereof. The device is thus sufficiently suitable for use as a protection circuit.

In accordance with the device of the fourth aspect, the two resistive elements are formed in the portions of the SOI layer between the partial isolating layer and the buried insulation film. Thus, the resistance can be readily set to a moderately high value. This stabilizes the operation of the semiconductor controlled rectifier and accelerates the turn-on operation thereof. Further, it is also readily feasible to adjust the resistance to a desired value by adjusting the widths and lengths of the portions of the SOI layer in which the resistive elements are formed, and impurity concentration therein.

In accordance with the device of the fifth aspect, the presence of other two resistive elements stabilizes the operation of the semiconductor controlled rectifier. Further, it is also readily feasible to set the resistance to a desired value by adjusting the widths and lengths of the portions of the SOI layer in which the other two resistive elements are formed, and impurity concentration therein.

In accordance with the device of the sixth aspect, the resistance of the other two resistive elements are set lower than that of the two resistive elements, which accelerates the turn-on operation of the semiconductor controlled rectifier. Further, the resistance can be readily adjusted by varying impurity concentration.

In accordance with the device of the seventh aspect, the two bipolar transistors are formed as parasitic bipolar transistors of MOSFETs. This facilitates the manufacturing processes and reduces the cost of manufacture.

In accordance with the device of the eighth aspect, the two MOSFETs each have its gate connected to the source. This reduces the holding voltage of the semiconductor controlled rectifier and accelerates the turn-on operation thereof.

In accordance with the device of the ninth aspect, the two MOSFETs each have a metal-semiconductor compound film which establishes a connection between the gate and the source. The gate can thus be short-circuited with the source with low resistance and stability.

In accordance with the device of the tenth aspect, in each of the two MOSFETs, the metal-semiconductor compound film which establishes a connection between the gate and the source also establishes a connection to the body. Thus, the body potential can be fixed to the source potential with low resistance and stability.

In accordance with the device of the eleventh aspect, the two bipolar transistors are equivalently formed of semiconductor layers, which are alternately jointed in an p-n-p-n order. This allows a reduction in device size.

In accordance with the device of the twelfth aspect, the diode is a BCG diode and thus superior in switching characteristics because the ratio of current to voltage variations is high in an ON to OFF or OFF to ON transition. This further encourages the positive feedback function of the semiconductor controlled rectifier.

In accordance with the device of the thirteenth aspect, the BCG diode has a metal-semiconductor compound film which establishes a connection between the body and one side of the source and the drain. The above one side and the body can thus be short-circuited with low resistance and stability. This reduces the resistance of the diode and thus increases the current flowing therethrough, thereby speeding up the switching operation of the semiconductor controlled rectifier.

In accordance with the device of the fourteenth aspect, in the BCG diode, the metal-semiconductor compound film is also connected to the gate. Thus, the above one side, the body, and the gate can be short-circuited with low resistance and stability.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram of the device of FIG. 1;

FIG. 5 is a cross-sectional view of another device according to the first preferred embodiment;

FIG. 6 is a circuit diagram of the device of FIG. 5;

FIG. 30 is a circuit diagram of the device of FIG. 26;

FIG. 36 is a circuit diagram of the device of FIG. 31;

DESCRIPTION OF THE PREFERRED EMBODIMENTS

In a semiconductor device according to each preferred embodiment described below, a diode is connected inversely in parallel to one of two bipolar transistors constituting an SCR. This encourages a positive feedback function of the SCR, thereby enhancing current drivability and accelerating a turn-on operation.

In the specification of the present invention, the "inverse-parallel connection" refers to a parallel connection that the collector of a bipolar transistor is connected to one of the anode and cathode of a diode and the emitter of the bipolar transistor is connected to the other of the anode and cathode in such a direction as to allow the circulation of a forward current through both the bipolar transistor and the diode. In other words, the "inverse-parallel connection" between a pnp bipolar transistor and a diode refers to a form of connection that the emitter is connected to the cathode and the collector to the anode, while the "inverse-parallel connection" between an npn bipolar transistor and a diode refers to a form of connection that the emitter is connected to the anode and the collector to the cathode.

In the following preferred embodiments, a semiconductor layer (e.g., an SOI layer) in which a semiconductor device is formed is primarily composed of silicon; however, the present invention is not limited thereto and is also applicable to other semiconductor layers whose principal component is other than silicon.

1. First Preferred Embodiment

Referring now to FIGS. 1 to 4, a semiconductor device of a first preferred embodiment will be discussed in detail.

1-1. Device Construction

Figure 1:
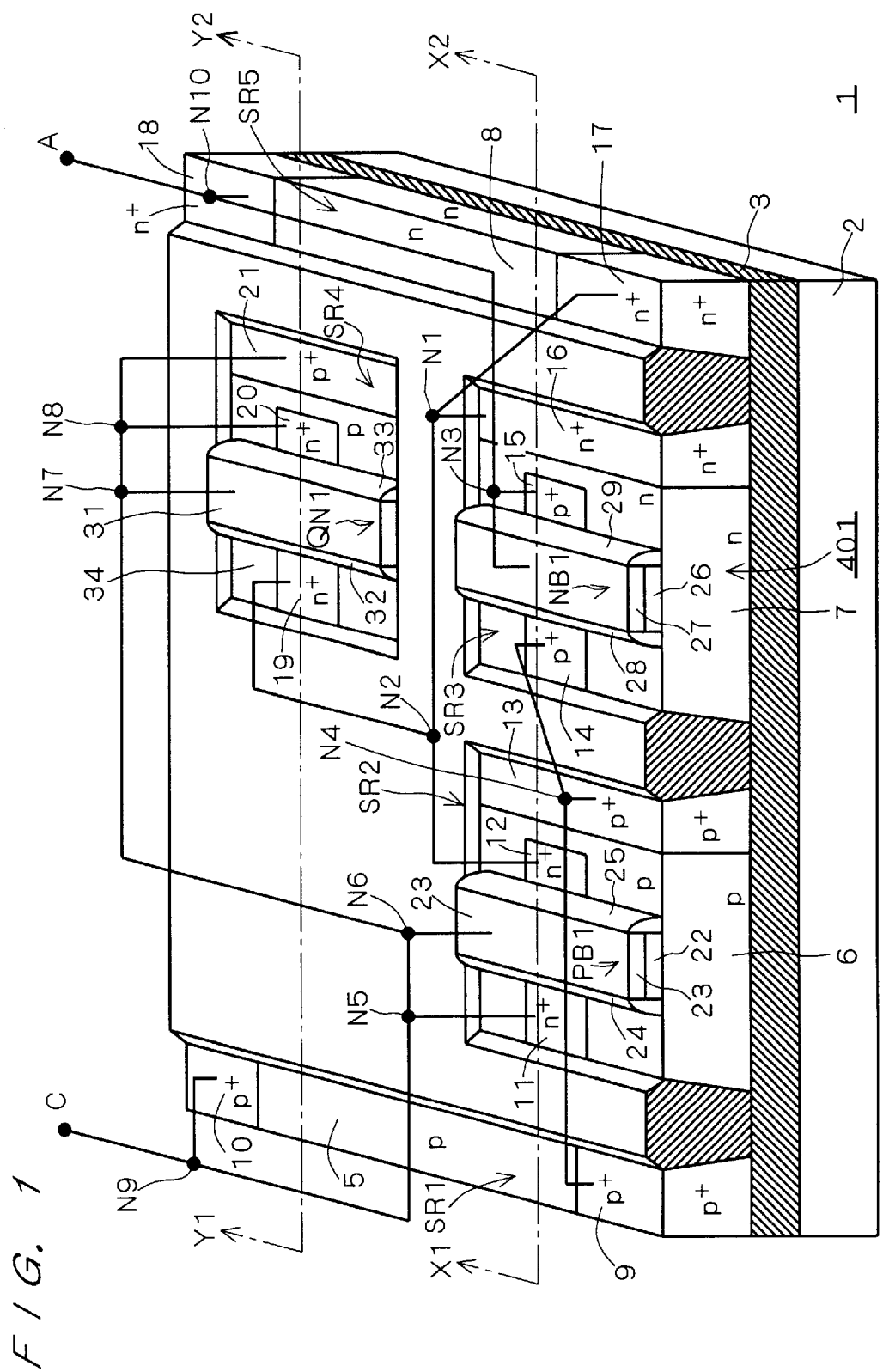
FIG. 1 is a perspective view of a semiconductor device according to a first preferred embodiment.
Figure 2:
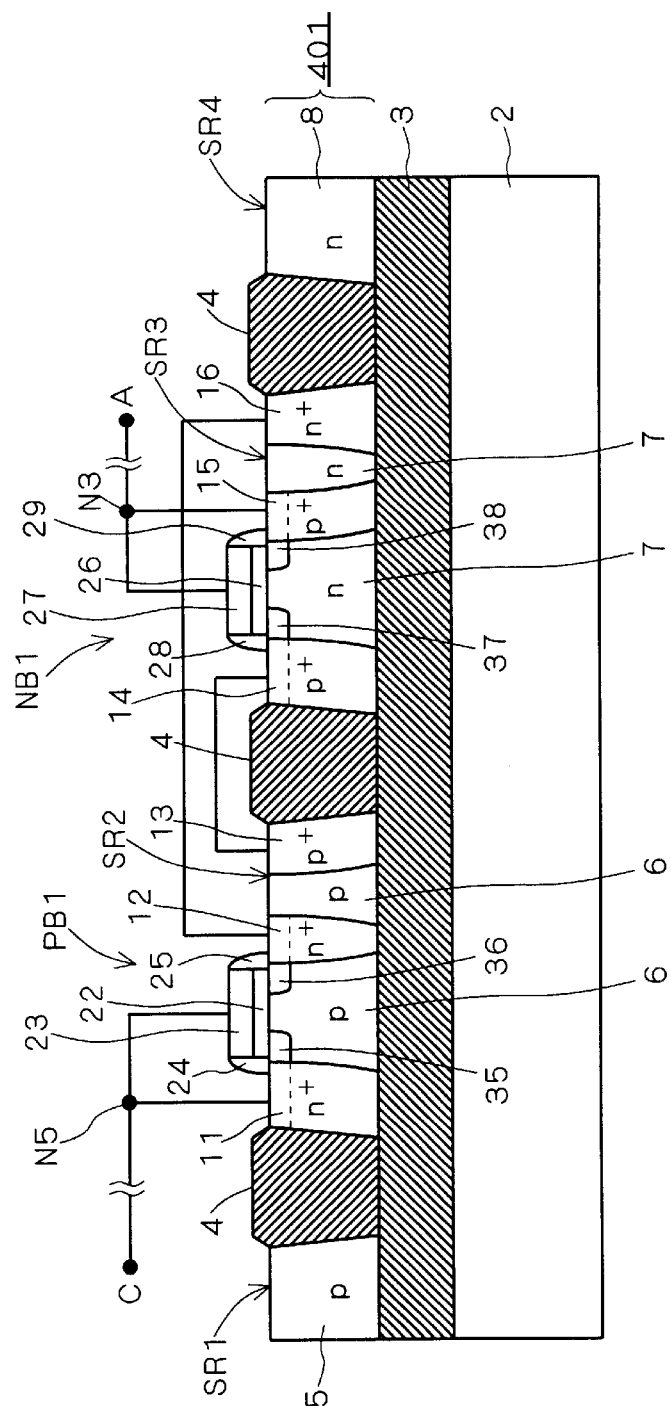
FIG. 2 is a cross-sectional view of the device of FIG. 1, taken along the section line X1-X2.
Figure 3:
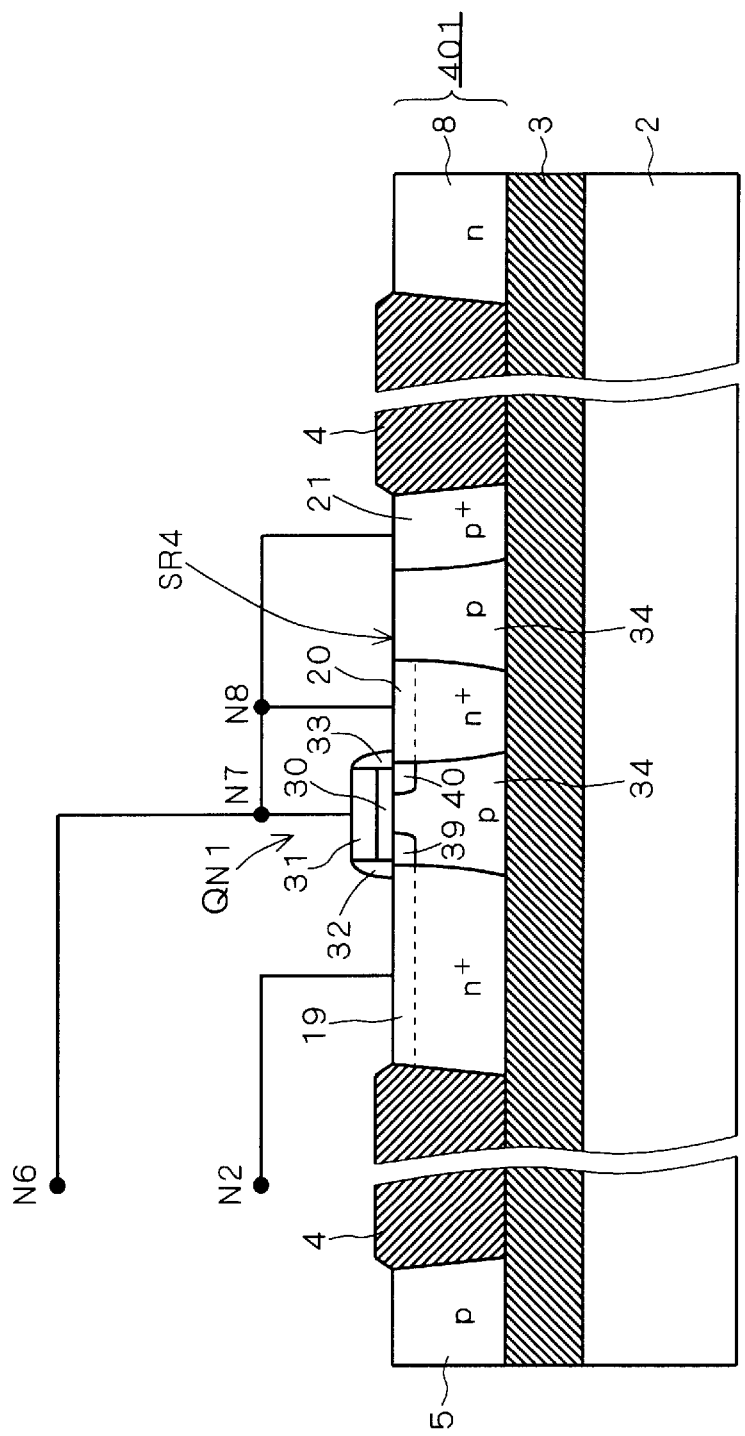
FIG. 3 is a cross-sectional view of the device of FIG. 1, taken along the section line Y1-Y2.

FIG. 1 is a perspective view of a semiconductor device 1 of the first preferred embodiment when viewed angularly from the above. FIGS. 2 and 3 are cross-sectional views of the semiconductor device 1 of FIG. 1, taken along the section lines X1-X2 and Y1-Y2, respectively; and FIG. 4 is a circuit diagram thereof.

The semiconductor device 1 is formed in an SOI substrate including a supporting substrate 2, a buried insulation film 3, and an SOI layer 401. In the main surface of the SOI layer 401 which is primarily composed of silicon, STI as a full isolating layer 4 which reaches the buried insulation film 3 is selectively formed, by which a plurality of element regions SR1 to SR5 are fully isolated from each other.

In the element region SR1, $p^+$ layers 9, 10 and a p layer 5 are formed. The p layer 5 forms a resistive element R2. In the element region SR5, $n^+$ layers 17, 18 and an n layer 8 are formed. The n layer 8 forms a resistive element R1.

In the element region SR2, a p layer 6, n layers 35, 36, $n^+$ layers 11, 12, and a $p^+$ layer 13 are formed. The n layer 35 and the $n^+$ layer 11 form the source of an n-channel MOSFET, and the n layer 36 and the $n^+$ layer 12 form the drain thereof. In particular, the n layers 35, 36 make extensions which are parts of the source/drain.

Part of the p layer 6 is opposed to a gate 23 with a gate insulating film 22 therebetween. Further, sidewalls or insulators 24, 25 are formed on the side surfaces of the gate 23. The p layer 6 and the $p^+$ layer 13 form the body of the n-channel MOSFET. Especially, a portion of the p layer 6 of the body which is sandwiched between the source/drain 11, 35, 12, and 36 and is opposed to the gate 23 functions as a channel. Also, the $p^+$ layer 13 of the body where a connection with wiring is made corresponds to a body contact region.

The n+ layer 11, the p layer 6 (and the p⁺ layer 13), and the n⁺ layer 12 form the emitter, base, and collector of an npn bipolar transistor PB1, respectively. That is, the element region SR2 has formed therein the bipolar transistor PB1 as a parasitic bipolar transistor of the n-channel MOSFET.

The element region SR3 is formed to be symmetrical to the element region SR2 with respect to the conductivity type. More specifically, an n layer 7, p layers 37, 38, p⁺ layers 14, 15, and an n⁺ layer 16 are formed in the element region SR3. The p layer 37 and the p⁺ layer 14 form the drain of a p-channel MOSFET, and the p layer 38 and the p⁺ layer 15 form the source thereof. In particular, the p layers 37, 38 make extensions which are parts of the source/drain.

Part of the n layer 7 is opposed to a gate 27 with a gate insulating film 26 therebetween. Further, sidewalls or insulators 28, 29 are formed on the side surfaces of the gate 27. The n layer 7 and the n⁺ layer 16 form the body of the p-channel MOSFET. Especially, a portion of the n layer 7 of the body which is sandwiched between the source/drain 14, 37, 15, and 38 and is opposed to the gate 27 functions as a channel. Also, the n⁺ layer 16 of the body where a connection with wiring is made corresponds to a body contact region.

The p⁺ layer 14, the n layer 7 (and the n⁺ layer 16), and the p⁺ layer 15 form the collector, base, and emitter of a pnp bipolar transistor NB1, respectively. That is, the element region SR3 has formed therein the bipolar transistor NB1 as a parasitic bipolar transistor of the p-channel MOSFET.

The base and collector of the bipolar transistor PB1 are individually connected to the collector and base of the bipolar transistor NB1 through the wiring. The bipolar transistors NB1 and PB1 thus constitute a positive feedback circuit. In FIGS. 1 to 4, nodes N1 to N10 represent connections in the wiring.

The emitter and base of the bipolar transistor PB1 are connected with each other through the wiring and the resistive element R2, while the emitter and base of the bipolar transistor NB1 are connected with each other through the wiring and the resistive element R1. This is equivalent to the condition that the p layer 6 as the body of the n-channel MOSFET is fixed to the n⁺ layer 11 as the source thereof through the resistive element R2 and the n layer 7 as the body of the p-channel MOSFET is fixed to the p⁺ layer 15 as the source thereof through the resistive element R1.

Further, the gate 23 is connected through the wiring to the n⁺ layer 11 as the source, while the gate 27 is connected through the wiring to the p⁺ layer 15 as the source. One end of the resistive element R1 is connected through the wiring to the anode A, and one end of the resistive element R2 is connected through the wiring to the cathode C. That is, the bipolar transistors PB1, NB1 and the resistive elements R1, R2 constitute an SCR 400.

Besides this SCR 400, the semiconductor device 1 comprises a diode QN1 in the element region SR4. In the element region SR4, a p layer 34, n layers 39, 40, n⁺ layers 19, 20, and a p⁺ layer 21 are formed. The n layer 39 and the n⁺ layer 19 form one side (hereinafter referred to as a "drain") of the source/drain of an n-channel MOSFET, and the n layer 40 and the n⁺ layer 20 form the other side (hereinafter referred to as a "source") thereof. In particular, the n layers 39 and 40 make extensions which are parts of the source/drain.

Part of the p layer 34 is opposed to a gate 31 with a gate insulating film 30 therebetween. Further, sidewalls or insulators 32, 33 are formed on the side surfaces of the gate 31.

The p layer 34 and the p⁺ layer 21 form the body of the n-channel MOSFET. Especially, a portion of the p layer 34 of the body which is sandwiched between the source/drain 19, 39, 20, and 40 and is opposed to the gate 31 functions as a channel. Also, the p⁺ layer 21 of the body where a connection with wiring is made corresponds to a body contact region.

The p layer 34 (and the p⁺ layer 21), the n⁺ layer 20, and the gate 321 are connected with each other through the wiring. That is, the body potential and the gate potential are fixed to the source potential in the n-channel MOSFET formed in the element region SR4. Consequently, this MOSFET serves as a body coupled gate (BCG) diode. That is, the diode QN1 is formed as a p/n⁺ type BCG diode.

The p layer 34 (and the p⁺ layer 21), serving as the anode of the diode QN1, is connected to the emitter of the transistor PB1 through the wiring, while the n⁺ layer 19, serving as the anode of the diode QN1, is connected to the collector of the transistor PB1 through the wiring. That is, the diode QN1 is connected inversely in parallel to the transistor PB1.

1-2. Device Operation

Figure 42:
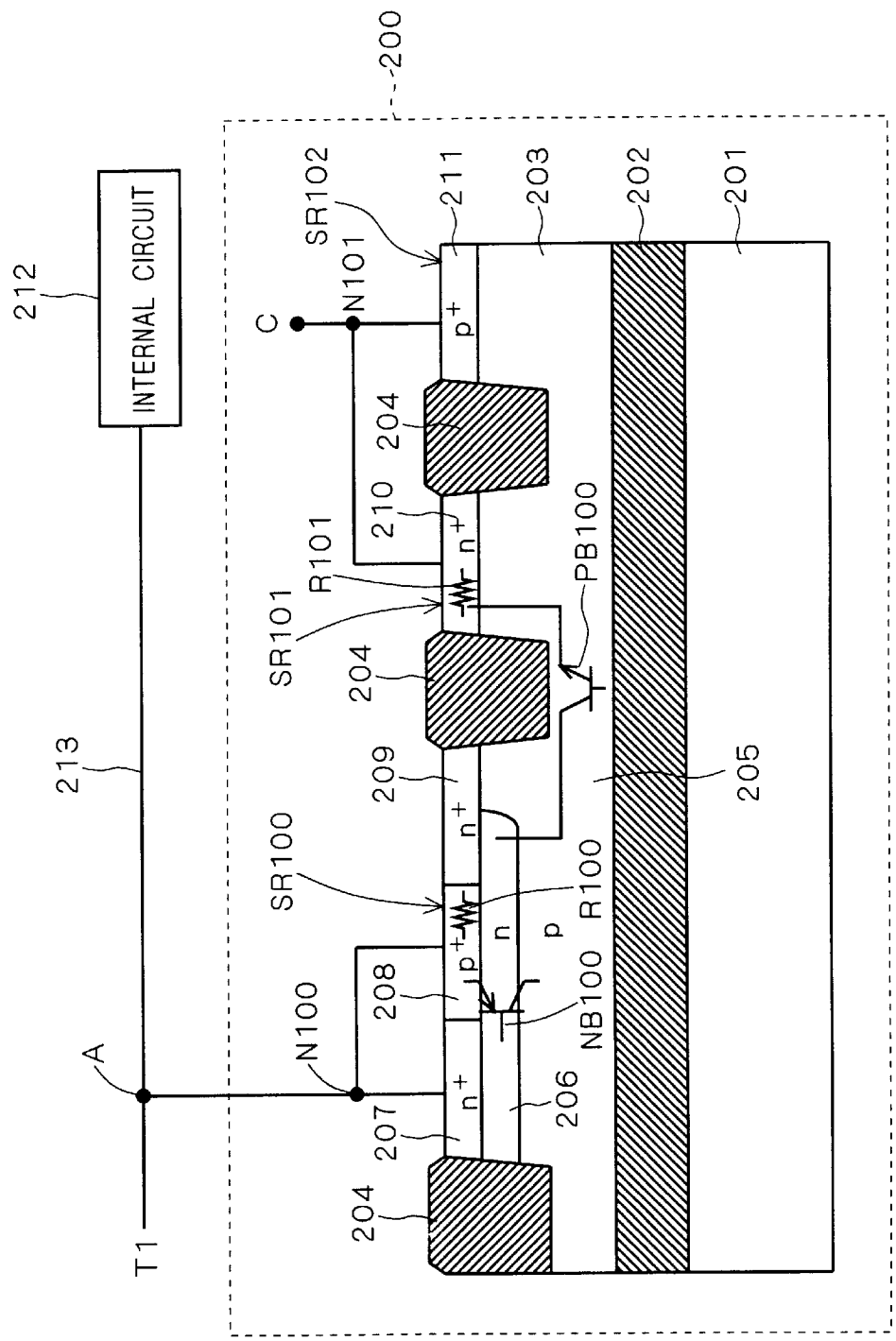
FIG. 42 is a perspective view of a conventional semiconductor device.
Figure 43:
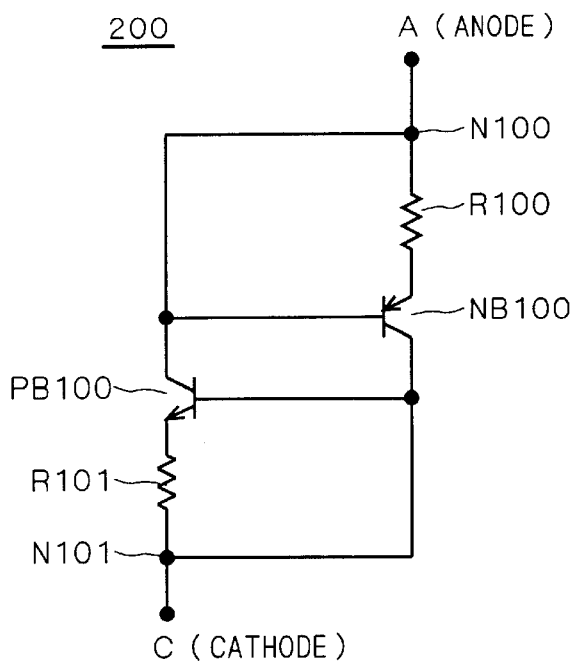
FIG. 43 is a circuit diagram of the device of FIG. 42.
Figure 44:
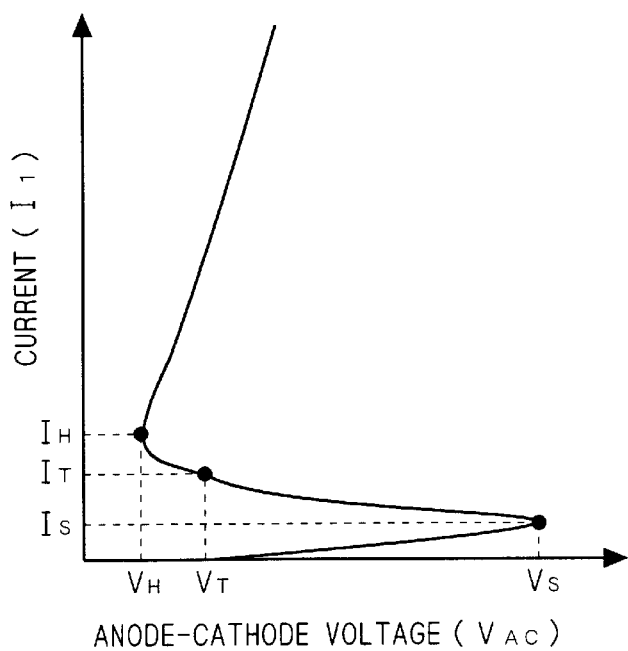
FIG. 44 is an explanatory diagram of the operation of the device of FIG. 42.
Figure 45:
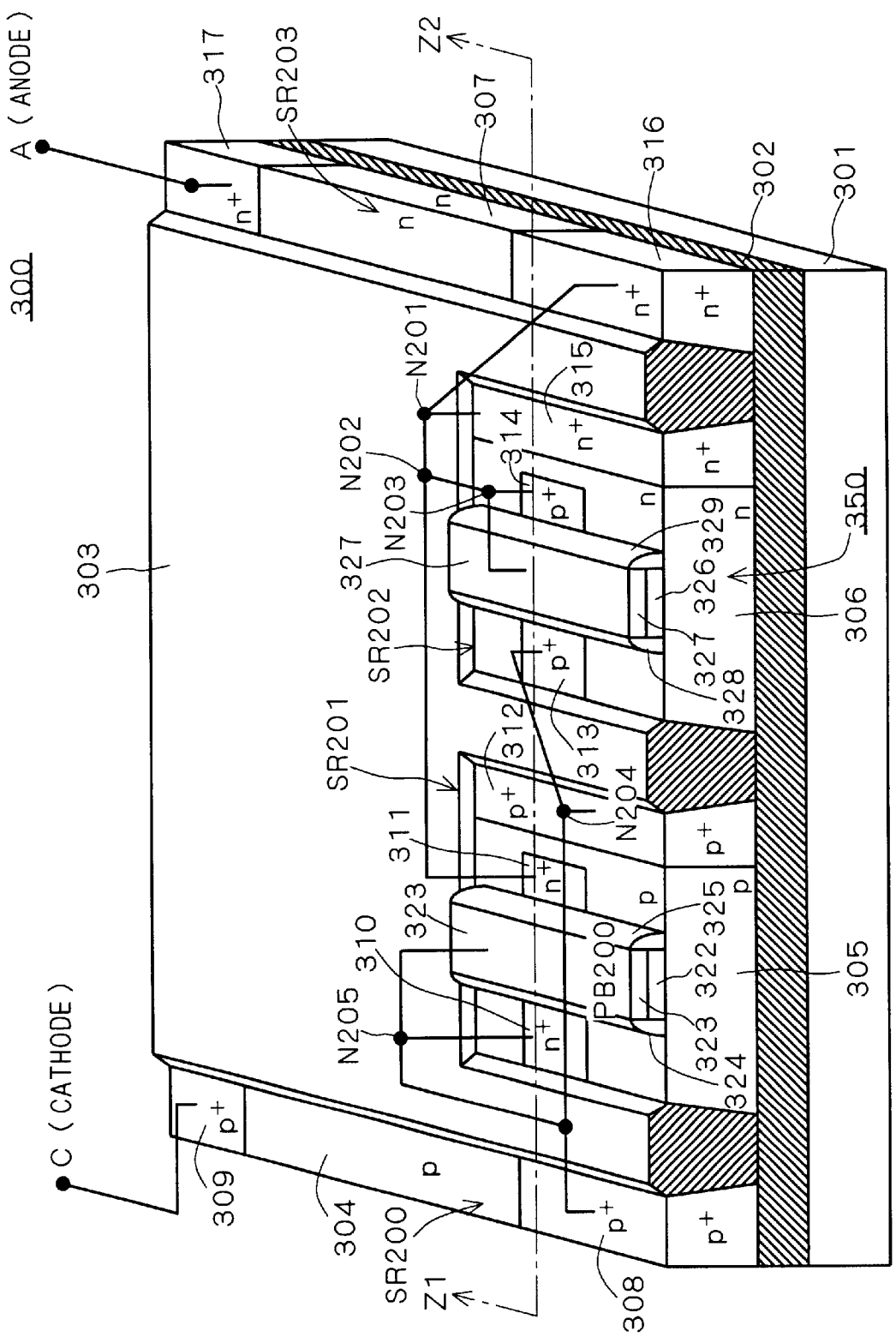
FIG. 45 is a perspective view of another conventional semiconductor device.
Figure 46:
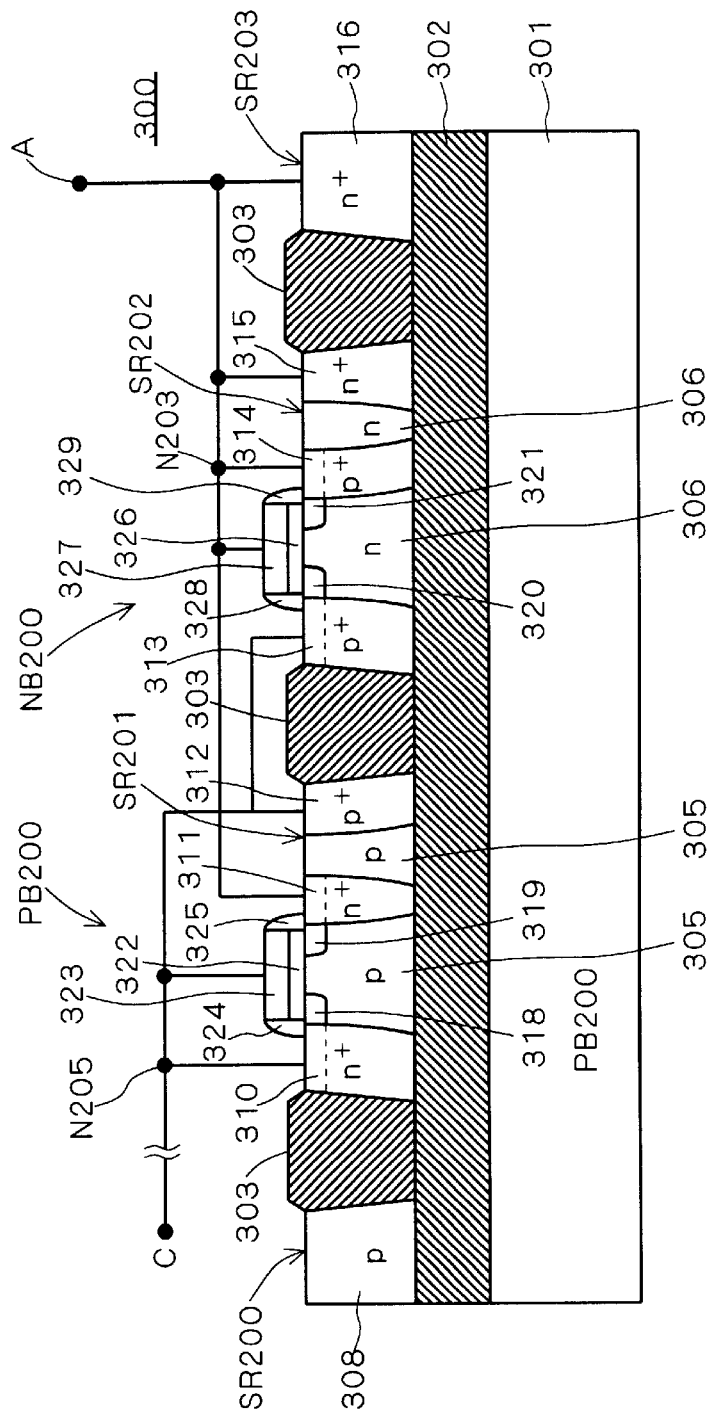
FIG. 46 is a cross-sectional view of the device of FIG. 45, taken along the section line Z1-Z2.
Figure 47:
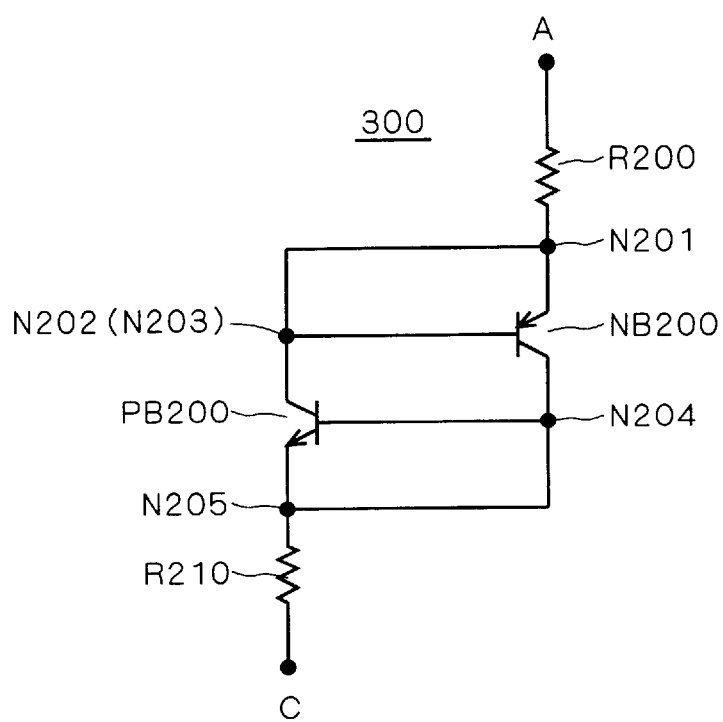
FIG. 47 is a circuit diagram of the device of FIG. 45.

With such a construction, the semiconductor device 1 is suitable for use as a protection circuit for protecting an integrated circuit being protected (internal circuit 212 of FIG. 42) against ESD. When the voltage of the input signal T1 (FIG. 42) overshoots because of ESD and thereby a voltage of $V_{DD}+\Delta V_{DD}$ higher than the source voltage $V_{DD}$ is applied to the anode A, both the transistors PB1 and NB1 are turned on. Since the base of the transistor NB1 is connected to the collector of the transistor PB1 and the base of the transistor PB1 is connected to the collector of the transistor NB1, increased base current and increased collector current on one side results in an increase in base current on the other side. That is, the transistors NB1 and PB1 each perform a positive feedback function for the other. Thus, the application of ESD causes the SCR 400 to transit to its ON state.

At this time, positive feedback is taking place when the potential on the node N2 is higher than that on the node N5. In the absence of the diode QN1, if a flow of reverse current causes the potential on the node N2 to fall below the potential on the node N5, the collector-emitter voltage of the transistor PB1 becomes negative, the transistor PB1 is cut off, and positive feedback does not take place. The diode QN1 has a rectification function of producing a flow of current when the potential on the node N2 is lower than that on the node N5. Thus, the collector-emitter voltage of the transistor PB1 does not go negative and the transistor PB1 is never cut off. That is, the diode QN1 encourages the positive feedback function of the SCR 400, which results in a reduction in the holding voltage $V_H$ of the SCR 400.

More specifically, the diode QN1, which encourages the positive feedback function of the SCR 400, enhances the current drivability of the SCR 400 and accelerates the turn-on operation thereof. The semiconductor device 1 can thus show high protection capability when used as a protection circuit.

In the semiconductor device 1, the bipolar transistors PB1 and NB1 are formed as parasitic bipolar transistors of the MOSFETs. This brings the advantages of easy manufacturing processes and reduced manufacturing costs.

In the semiconductor device 1, further, the bipolar transistors PB1 and NB1 each have its base and emitter connected with each other through one of the resistive elements R1 and R2. In other words, the body of the MOSFET with the bipolar transistor PB1 or NB1 as its parasitic bipolar transistor is fixed to the source thereof through the resistive element. This allows carriers occurring at the pn junction of the MOSFET to be absorbed through terminals which are connected to the body; therefore, the bipolar transistor can perform a stabilized operation without depending on the history of operations. That is, there is an advantage of a stabilized operation of the SCR 400.

Further, the MOSFETs with the bipolar transistors PB1 and NB1 as their respective parasitic bipolar transistors each have its gate connected to the source. This contributes to a reduction in the holding voltage $V_H$ of the SCR 400, thereby further accelerating the turn-on operation of the SCR 400.

Furthermore, the MOSFET which achieves the equivalent diode QN1 has its body (channel) connected to the source, which brings the advantage of lower depletion-layer capacitance $C_D$ than gate-insulating-layer capacitance $C_{OX}$. Thereby, a subthreshold swing S in a subthreshold region is reduced and an OFF to ON transition on the MOSFET, i.e., the diode QN1, is sharpened. Consequently, the positive feedback function of the SCR 400 is further encouraged. The subthreshold swing S can be expressed by the following approximate formula:

$$S = \frac{dV_G}{d\log I_D} \approx \log_{10}\frac{kT}{q}\left(1 + \frac{C_D}{C_{OX}}\right) \quad (1)$$

where $V_G$ is the gate voltage, $I_D$ is the drain current, q is the elementary electric charge, k is Boltzmann's constant, T is the absolute temperature, $C_D$ is the depletion-layer capacitance, and $C_{OX}$ is the gate-insulating-film capacitance. The smaller the subthreshold swing S, the sharper is the rising edge of current at the time of switching and the better is the switching characteristics.

Because the semiconductor device 1 is formed in the SOI layer 401 of the SOI substrate, the elements PB1, NB1, QN1, R1, and R2 can be readily isolated completely from one another. Although the SCR 400 is formed in the SOI layer, the positive-feedback encouraging function of the diode QN1 enhances the current drivability of the SCR 400 and accelerates the turn-on operation thereof. The semiconductor device 1 can thus fully show its capabilities as a protection circuit.

1-3. Modifications to First Preferred Embodiment

Instead of using the diode QN1 formed in the element region SR4, it is also feasible to use a diode QP1 shown in the cross-sectional view of FIG. 5 and the circuit diagram of FIG. 6. The diode QP1 is formed to be symmetrical to the diode QN1 with respect to the conductivity type. More specifically, an n layer 41, p layers 49, 50, p⁺ layers 42, 43, and an n⁺ layer 44 are formed in the element region SR4 of FIG. 5. The p layer 49 and the p⁺ layer 42 form one side (hereinafter referred to as a "drain") of the source/drain of a p-channel MOSFET, and the p layer 50 and the p⁺ layer 43 form the other side (hereinafter referred to as a "source") of the source/drain. In particular, the p layers 49 and 50 make extensions which are parts of the source/drain.

Part of the n layer 41 is opposed to a gate 46 with a gate insulating film 45 therebetween. Further, sidewalls or insulators 47 and 48 are formed on the side surfaces of the gate 46. The n layer 41 and the n⁺ layer 44 form the body of the p-channel MOSFET. Especially, a portion of the n layer 41 which is sandwiched between the source/drain 42, 49, 43, and 50 and is opposed to the gate 46 functions as a channel. Also, the n⁺ layer 44 of the body where a connection with wiring is made corresponds to a body contact region.

The n layer 41 (and the n⁺ layer 44), the p⁺ layer 43, and the gate 46 are connected with each other through the wiring. That is, the body potential and the gate potential are fixed to the source potential in the p-channel MOSFET formed in the element region SR4. As a result, this MOSFET serves as a BCG (body coupled gate) diode. That is, the diode QP1 is formed as a p⁺/n type BCG diode.

The n layer 41 (and the n⁺ layer 44), serving as the cathode of the diode QP1, is connected to the collector of the transistor PB1 through the wiring, while the p⁺ layer 42, serving as the anode of the diode QP1, is connected to the emitter of the transistor PB1 through the wiring. That is, the diode QP1 is connected inversely in parallel to the transistor PB1. Accordingly, the diode QP1 performs similar functions as the diode QN1 does for the SCR 400.

In the semiconductor device 1, the diode QN1 is formed as a BCG diode and the bipolar transistors PB1 and NB1 as parasitic transistors of the MOSFETs, but it is to be understood that the present invention is not limited thereto. It is also feasible to use a typical diode as the diode QN1 and typical bipolar transistors as the bipolar transistors PB1 and NB1. Even in such a case, the effect of the diode encouraging the positive feedback function of the SCR would correspondingly be obtained.

2. Second Preferred Embodiment

Figure 7:
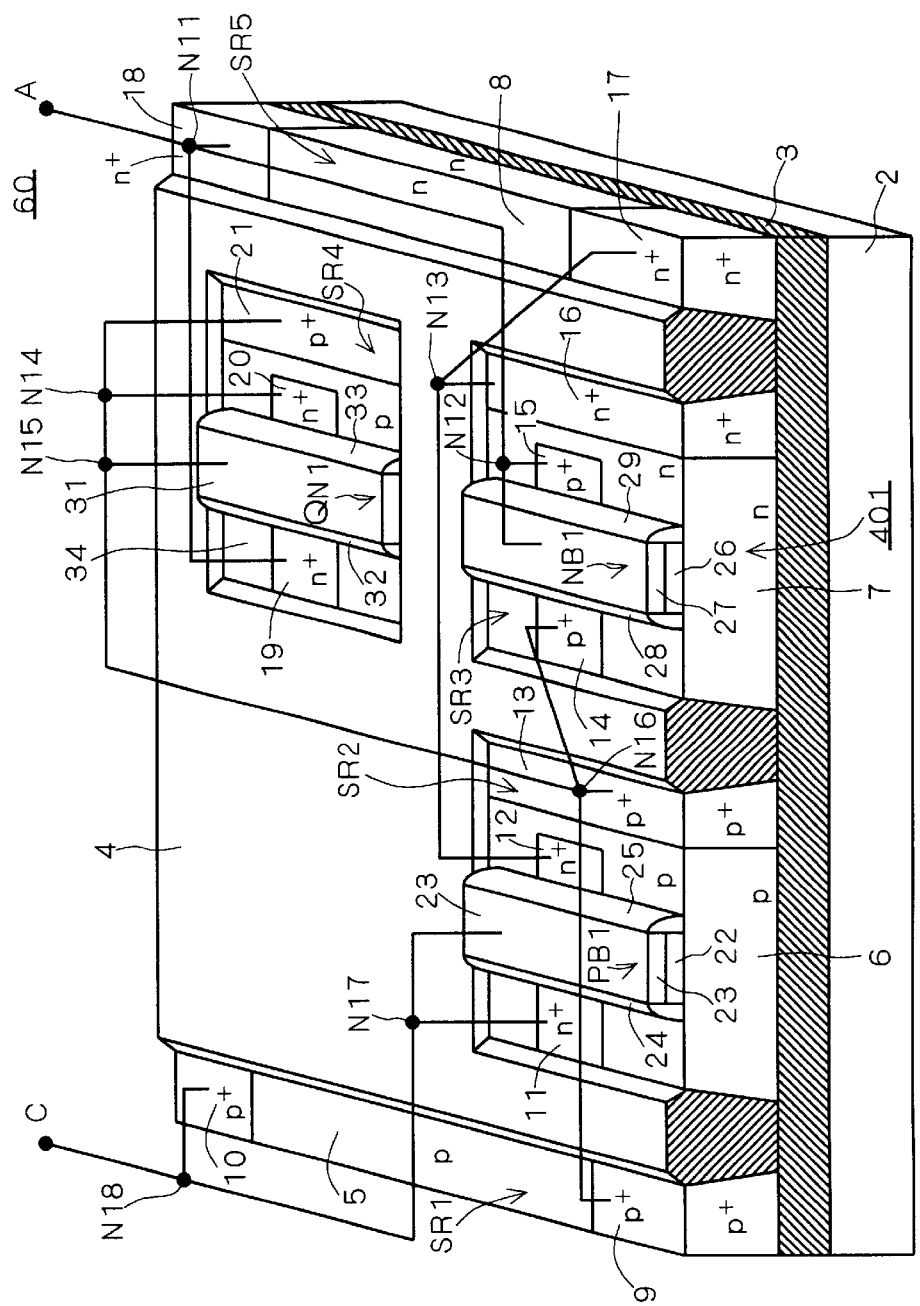
FIG. 7 is a perspective view of a semiconductor device according to a second preferred embodiment.
Figure 8:
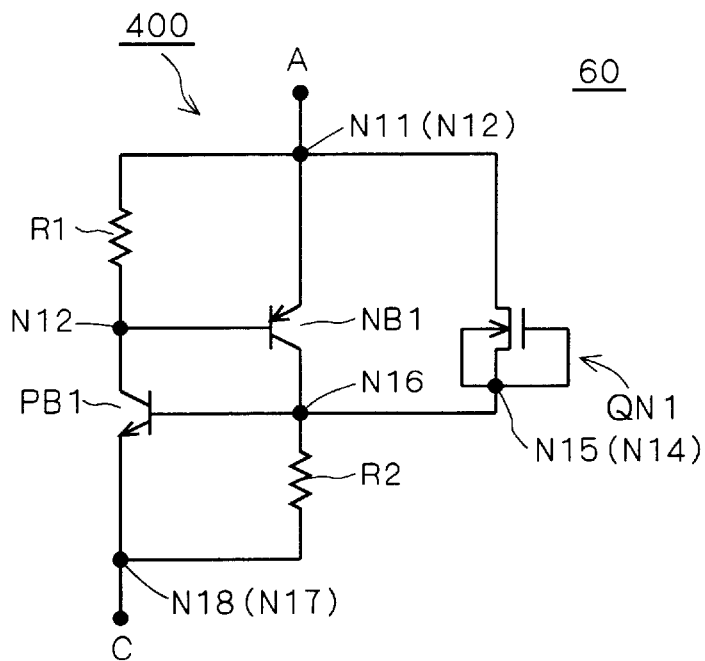
FIG. 8 is a circuit diagram of the device of FIG. 7.

FIG. 7 is a perspective view of a semiconductor device of a second preferred embodiment, when viewed angularly from the above. FIG. 8 is a circuit diagram of this semiconductor device 60 of FIG. 7. In the following drawings, the same reference numerals and characters are used for the same or corresponding parts (which have the same functions) as those of the semiconductor device 1 of the first preferred embodiment, and the detailed description thereof will be omitted.

The semiconductor device 60 characteristically differs from the semiconductor device 1 of the first preferred embodiment in that the diode QN1 is connected inversely in parallel not to the bipolar transistor PB1 but to the bipolar transistor NB1. FIG. 7 is different from FIG. 1 only in wiring. In FIGS. 7 and 8, nodes N11 to N18 represent connections in the wiring.

In the semiconductor device 60, also, the diode QN1 is connected inversely in parallel to one of the two bipolar transistors PB1 and NB1 constituting the SCR 400. Thus, the semiconductor device 60 brings the same effect as the semiconductor device 1 of the first preferred embodiment.

Figure 9:
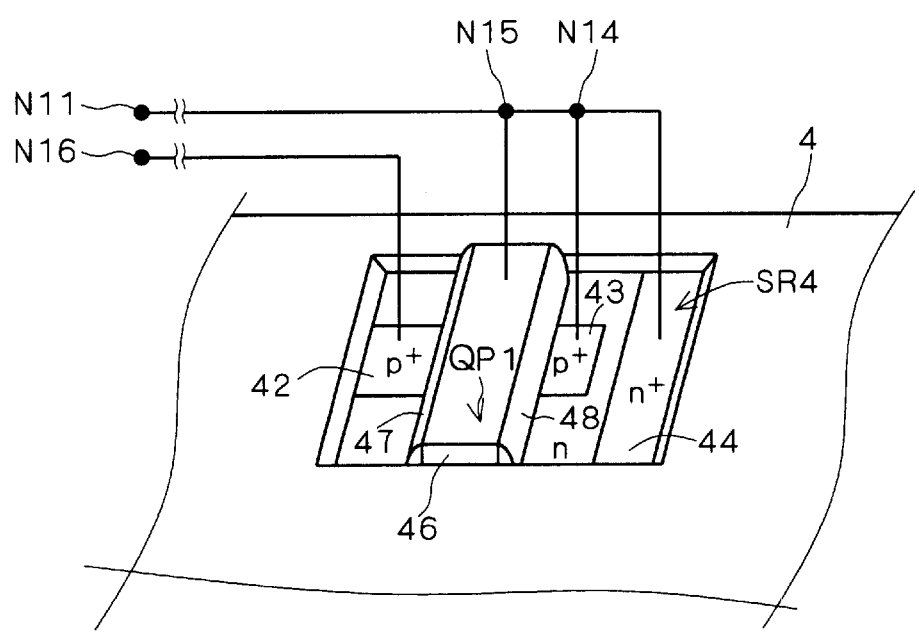
FIG. 9 is a partial perspective view of another device according to the second preferred embodiment.
Figure 10:
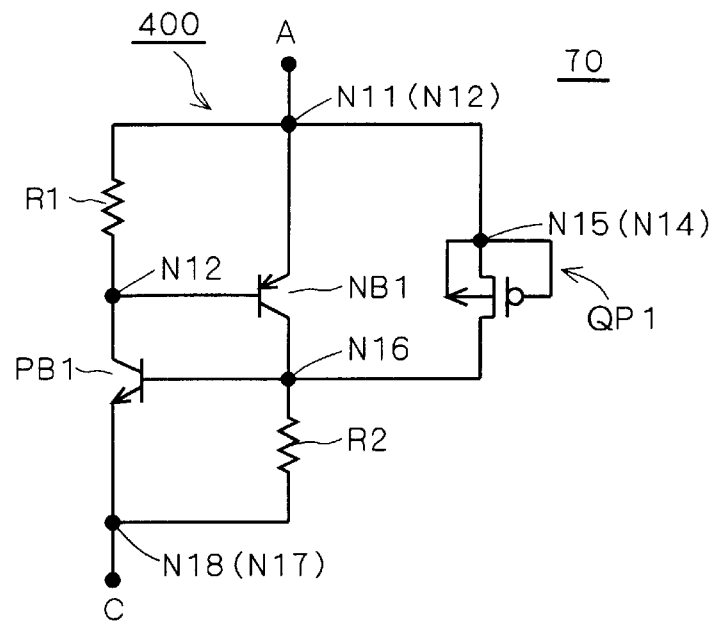
FIG. 10 is a circuit diagram of the device of FIG. 9.

Instead of using the diode QN1 formed in the element region SR4, it is also feasible to use the diode QP1 shown in the perspective view of FIG. 9 and the circuit diagram of FIG. 10. FIG. 9 is a perspective view of part of the semiconductor device 60 of FIG. 7 in the vicinity of the element region SR4. FIG. 9 is different from FIG. 5 only in wiring, and thus the diode QP1 of FIGS. 9 and 10 is equivalent to that of FIGS. 5 and 6. From this fact, the diode QP1 of FIGS. 9 and 10 performs similar functions as the diode QN1 of FIGS. 7 and 8 does.

3. Third Preferred Embodiment

Both the n⁺/p type BCG diode QN1 and the p⁺/n type BCG diode QP1 of the first and second preferred embodiments are configured such that the source (or drain), the gate, and the body are electrically connected with one another. In a semiconductor device of a third preferred embodiment, a metal silicide film (more generically a metal-semiconductor compound film) is formed across the surface of each region in the diode QN1 or QP1, whereby those regions are short-circuited with low resistance and stability.

3-1. Construction

Figure 11:
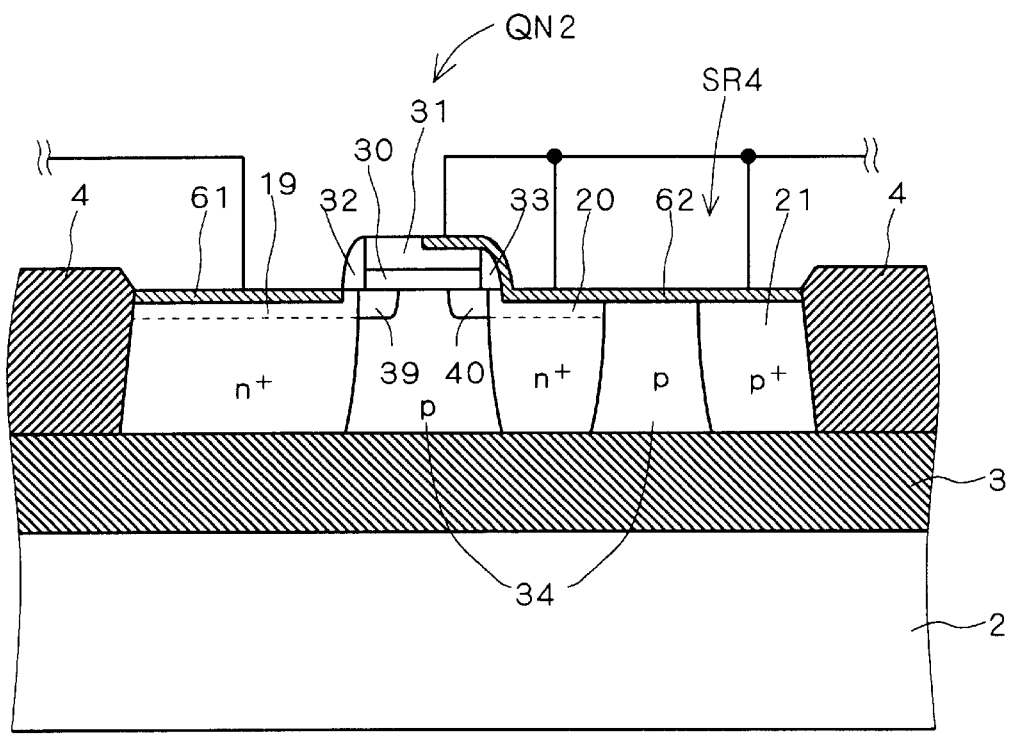
FIG. 11 is a cross-sectional view of a diode according to a third preferred embodiment.
Figure 12:
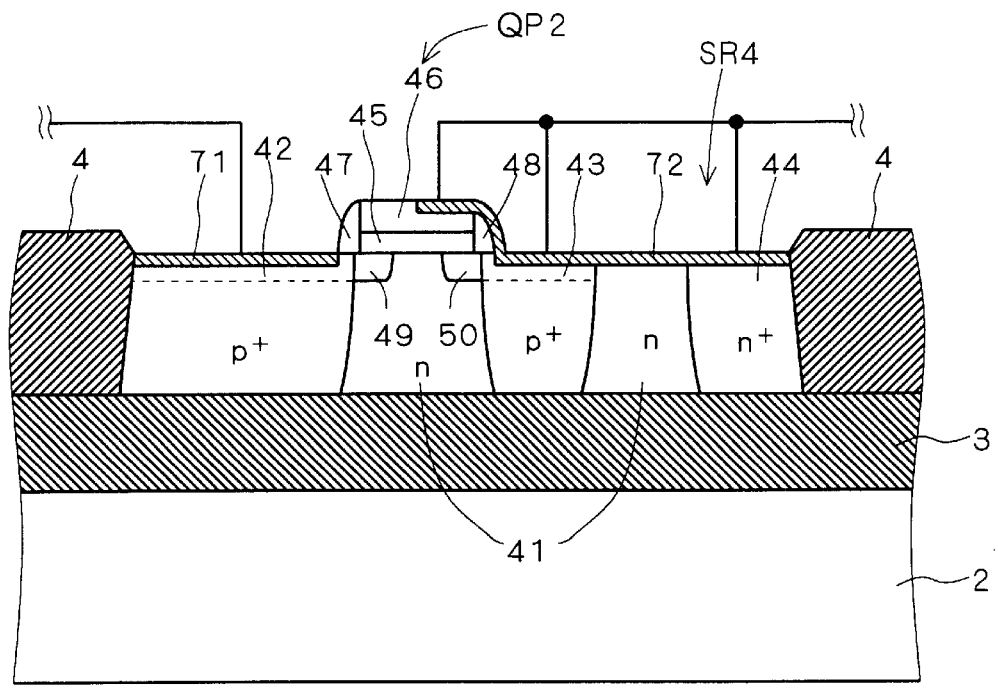
FIG. 12 is a cross-sectional view of another diode according to the third preferred embodiment.

FIGS. 11 and 12 are cross-sectional views of an n⁺/p type BCG diode and a p⁺/n type BCG diode, respectively, according to the third preferred embodiment. A diode QN2 shown in FIG. 11 has formed therein a metal silicide film 62 to cover the surfaces of part of the gate 31, the sidewall 33, the n⁺ layer 20, the p layer 34, and the p⁺ layer 21. This provides connections among the gate 31, the n⁺ layer 20, the p layer 34, and the p⁺ layer 21 with low resistance.

Wiring connected to the gate 31, the n⁺ layer 20, the p layer 34, and the p⁺ layer 21 is provided through the metal silicide film 62. Further, a metal silicide film 61 is formed to cover the surface of the n⁺ layer 19 and wiring connected to the n⁺ layer 19 is provided through the metal silicide film 61. This provides a connection between the wiring and each semiconductor layer with low resistance.

A diode QP2 shown in FIG. 12 is formed to be symmetrical to the diode QN2 of FIG. 11 with respect to the conductivity type. More specifically, the diode QP2 of FIG. 12 has formed therein a metal silicide film 72 to cover the surfaces of part of the gate 46, the sidewall 48, the p⁺ layer 43, the n layer 41, and the n⁺ layer 44. This provides connections among the gate 46, the p⁺ layer 43, the n layer 41, and the n⁺ layer 44 with low resistance.

Wiring connected to the gate 46, the p⁺ layer 43, the n layer 41, and the n⁺ layer 44 is provided through the metal silicide film 72. Further, a metal silicide film 71 is formed to cover the surface of the p⁺ layer 42 and wiring connected to the p⁺ layer 42 is provided through the metal silicide film 71. This provides a connection between the wiring and each semiconductor layer with low resistance.

The aforementioned metal silicide films 61, 62, 71, and 72 brings about the effect of increasing the amount of current flowing through the BCG diode QN1, QN2 by the amount of reduced resistance in the aforementioned n⁺/p or p⁺/n type BCG diode QN2, QP2, thereby to speed up the switching operation of the SCR 400 connected to the diode. Further, the metal silicide films 61, 62, 71, and 72 prevent a continuous application of a forward bias to the pn junctions covered therewith, thereby reducing leakage current.

3-2. First Example of Manufacturing Method

The diodes QN2 and QP2 of FIGS. 11 and 12 can be readily manufactured by combining conventionally known semiconductor processes. Referring now to the flow diagrams of FIGS. 13 to 24, three examples of the method of manufacturing the diode QN2 of FIG. 11 will be discussed. The diode QP2 of FIG. 12 can also be manufactured in a similar manner.

Figure 13:
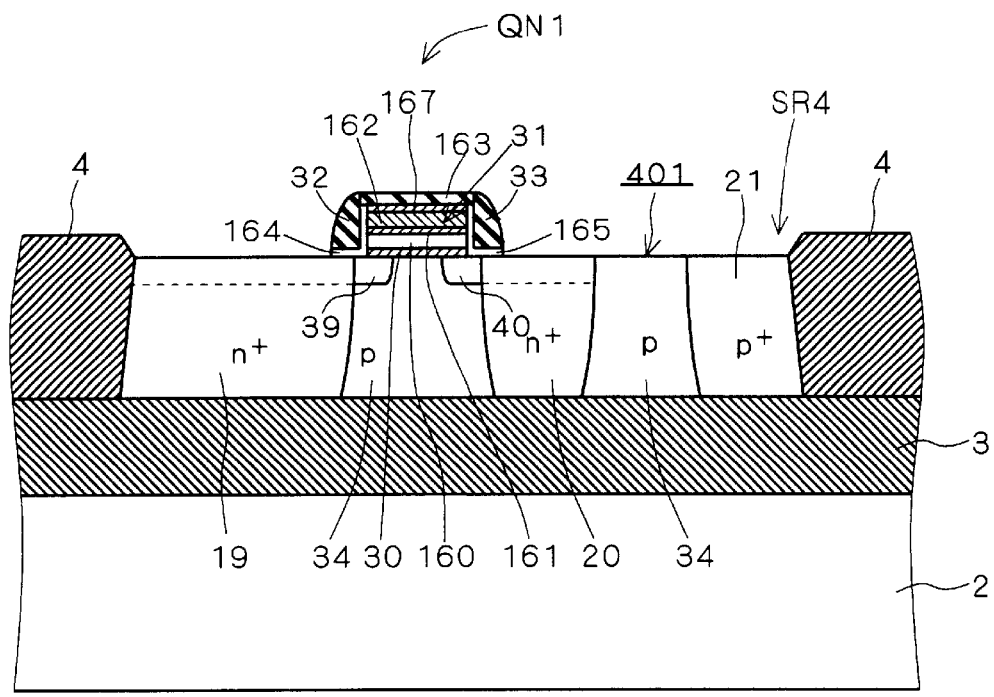
FIGS. 13 to 19 are process diagrams as a first example of a method of manufacturing the diode of FIG. 11.

FIGS. 13 to 19 are process diagrams as a first example of the manufacturing method. First, a diode of FIG. 13 is formed in the element region SR4. This diode may be equivalent to the diode QN1 in FIG. 3, but preferably, the gate 31 should have a three-layer construction, as shown in FIG. 13, with a polysilicon film 160, a barrier metal film 161, and a metal film 162 formed on the gate insulating film 30. In the polysilicon film 160, a high concentration of impurity elements are introduced. The barrier metal film 161, containing for example tungsten nitride (WNx), tantalum nitride (TaN), titanium nitride (TiN), or tantalum tungsten (TaW), has a barrier function of preventing the diffusion of constitutive elements between the polysilicon film 160 and the metal film 162. The metal film 162 is made of refractory metal such as tungsten.

On this gate 31, an insulation film 163 is formed with another barrier metal film 167 therebetween. Further, the sidewall spacers 32 and 33 are formed on both sides of the gate 31. There are interfacial layers 164 and 165 such as nitride films between the sidewall spacers 32, 33 and the gate 31 and between the sidewall spacers 32, 33 and the SOI layer 401 which constitutes a diffusion region.

Figure 14:
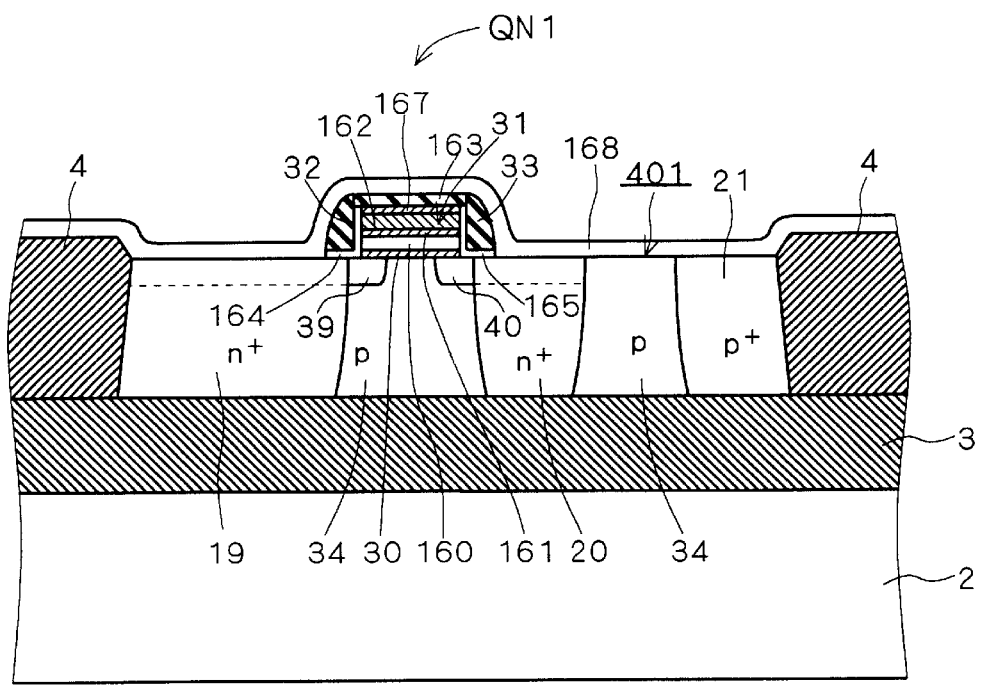

Then, metal for silicidation, such as cobalt, is deposited on the entire surface of this diode, to form a metal film 168 as shown in FIG. 14.

After that, high-temperature heat treatment such as RTA (rapid thermal annealing) is performed for example in nitrogen gas atmospheres. This causes reaction between the metal film 168 and silicon, thereby forming metal silicide. On the other hand, there is no metal silicide formed on the sidewall spacers 32, 33 and the insulation film 163 where the metal film 168 is not in contact with silicon; instead, a metal nitride film is formed or the unreacted metal film is left thereon. By removing such a metal nitride film or remaining metal film by etching, metal silicide films 169 and 170 are formed in a self-aligned manner on the exposed surface of the SOI layer 401 as shown in FIG. 15.

Figure 15:
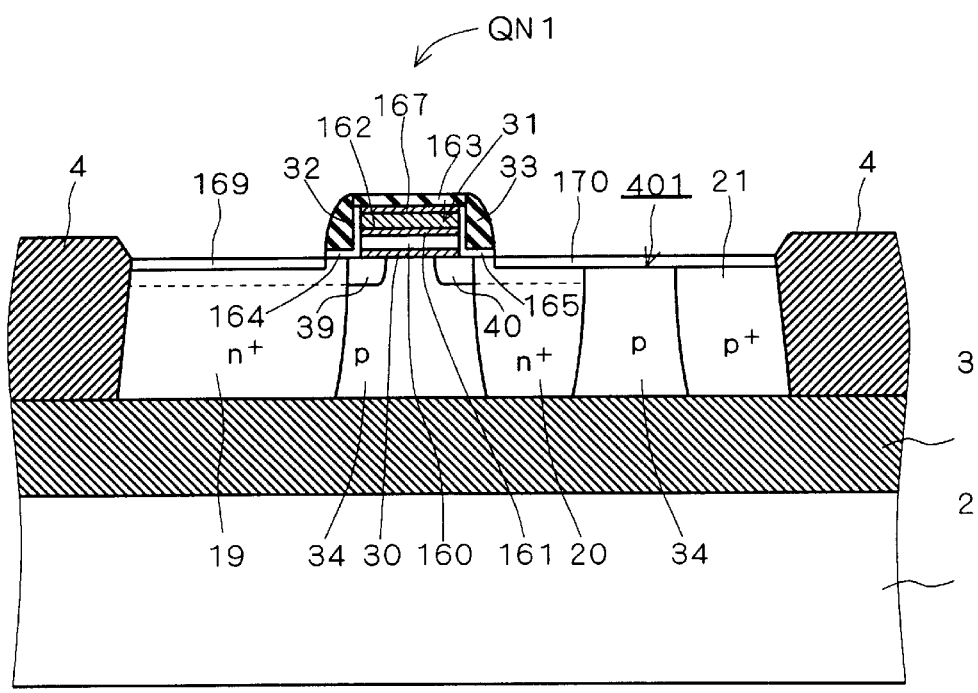
Figure 16:
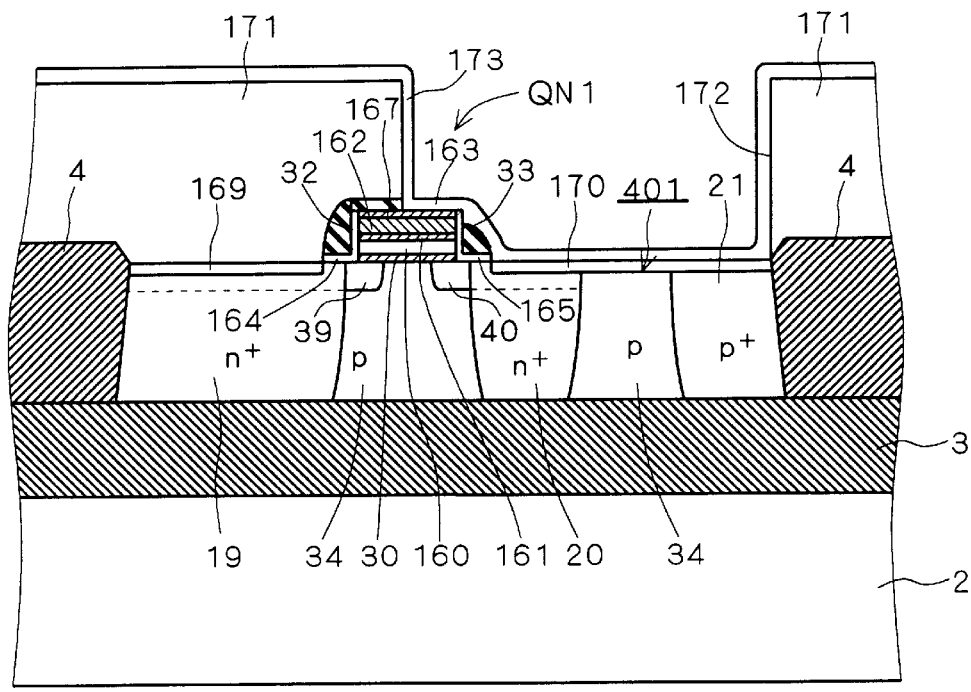

The entire surface of the interstage structure obtained through the step of FIG. 15, after an insulation layer 171 is deposited thereon, is then patterned using anisotropic etching techniques to form a trench 172 for the burial of a plug. At this stage, part of the surface of the metal film 162 constituting the gate 31 is exposed. Then, by using a sputtering apparatus or CVD system, a metal nitride film such as titanium nitride (TiN) is deposited along the inner wall of the trench 172 and further a polysilicon film is deposited on this metal nitride film with the CVD system. This provides a two-layer film 173 including the metal nitride film and the polysilicon film (FIG. 16).

The metal nitride/polysilicon film 173 is then partially removed in anisotropic etching process, except the portions formed to cover sidewalls 172a and 172b of the trench 172. For the small-diameter trench 172, part of the two-layer film 173 may be left on the bottom surface of the trench 172; however, it will cause no harm.

Figure 17:
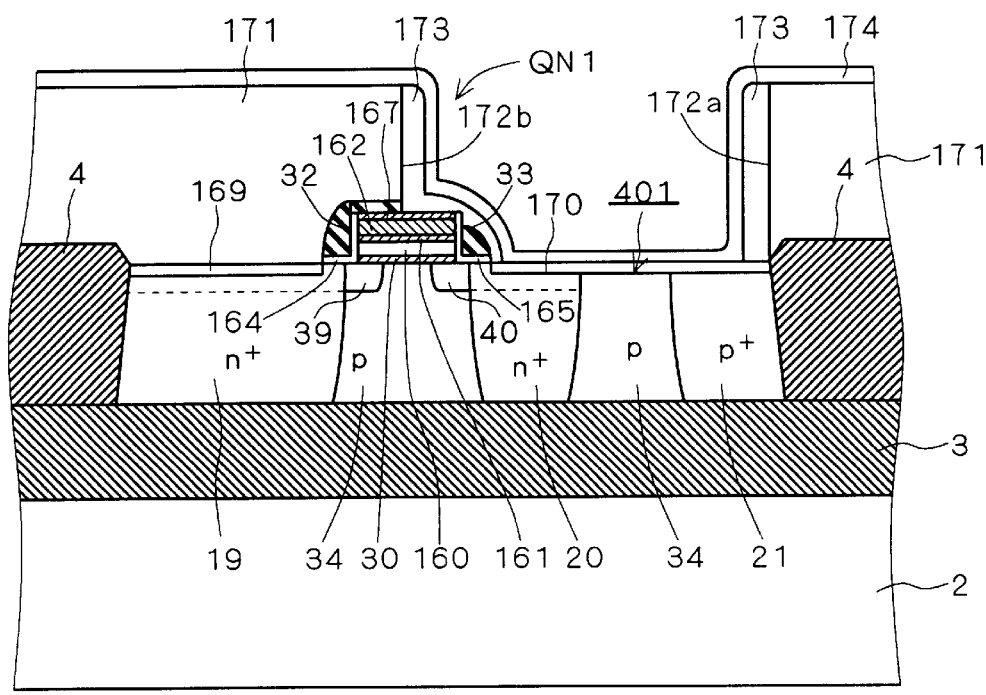

Then, a metal film 174 for silicidation is deposited on the entire surface of the interstage structure, and high-temperature heat treatment such as RTA is performed in nitride gas atmospheres. This causes reaction between the metal film 174 on the two-layer film 173 and silicon, thereby forming metal silicide (FIG. 17).

Figure 18:
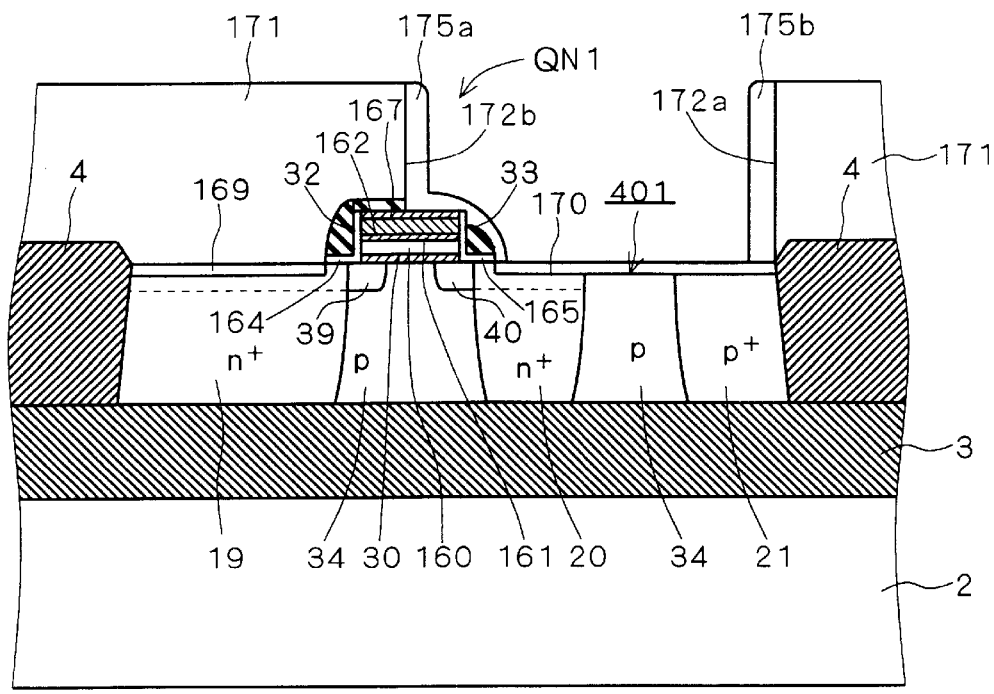

By removing the metal film 174 which did not react with silicon on the insulating layer 171 and the metal nitride film, metal silicide films 175a and 175b are formed on the sidewalls 172a and 172b of the trench 172 (FIG. 18). This provides electrical connections among the p layer 34, the n⁺ layer 20, and the gate 31.

Figure 19:
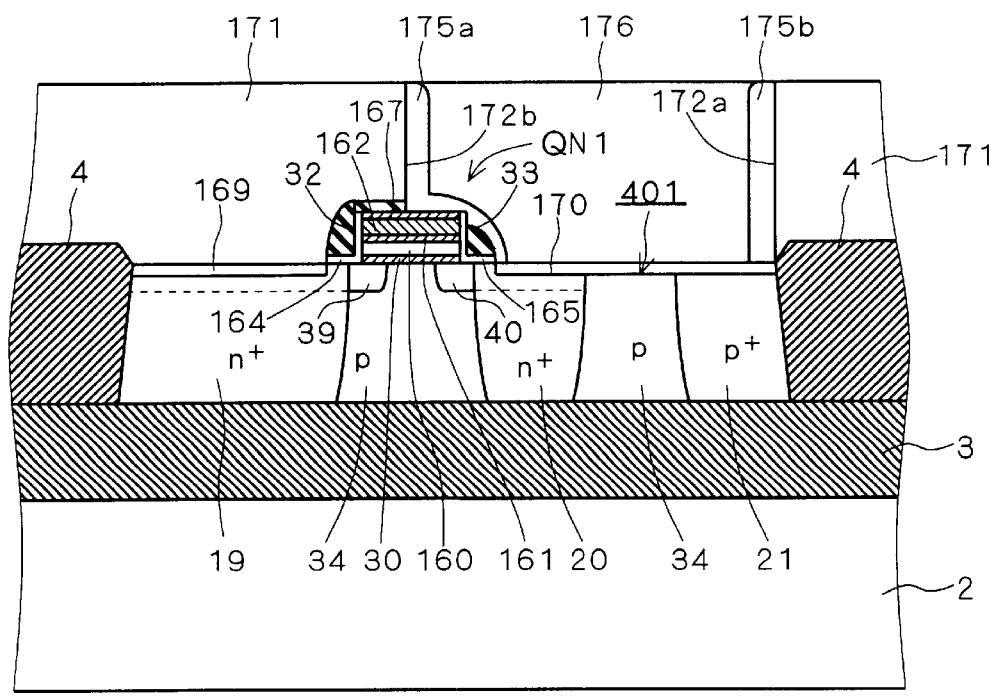

Then, metallic materials such as Mo, AlCu, Al, Cu, W, Ag, Au are buried in the trench 172 through the metal silicide films and the upper surface is planarized by using CMP (chemical-mechanical polishing) equipment. This provides a plug 176 as shown in FIG. 19. Alternatively, a barrier metal film (e.g., TiN, TaN, TaW, WNx) may be provided between the trench 172 and the plug 176. The aforementioned metal for silicidation may be Pt, Ti, W, Mo, Zr, Co, Ni, or the like.

3-3. Second Example of Manufacturing Method

Figure 20:
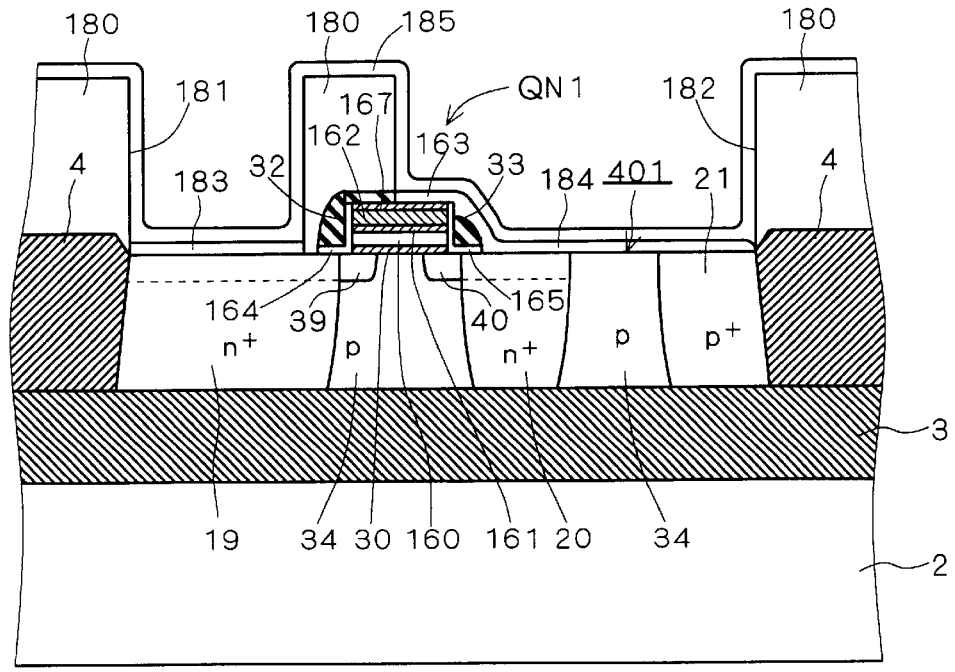
FIGS. 20 to 22 are process diagrams as a second example of the method of manufacturing the diode of FIG. 11.
Figure 21:
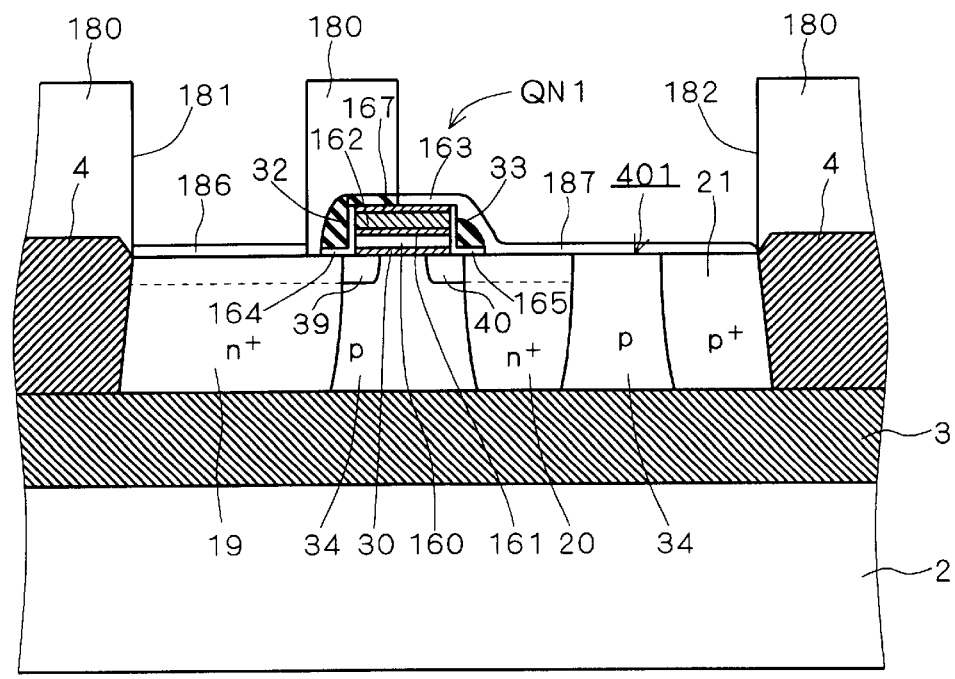
Figures 22, 23:
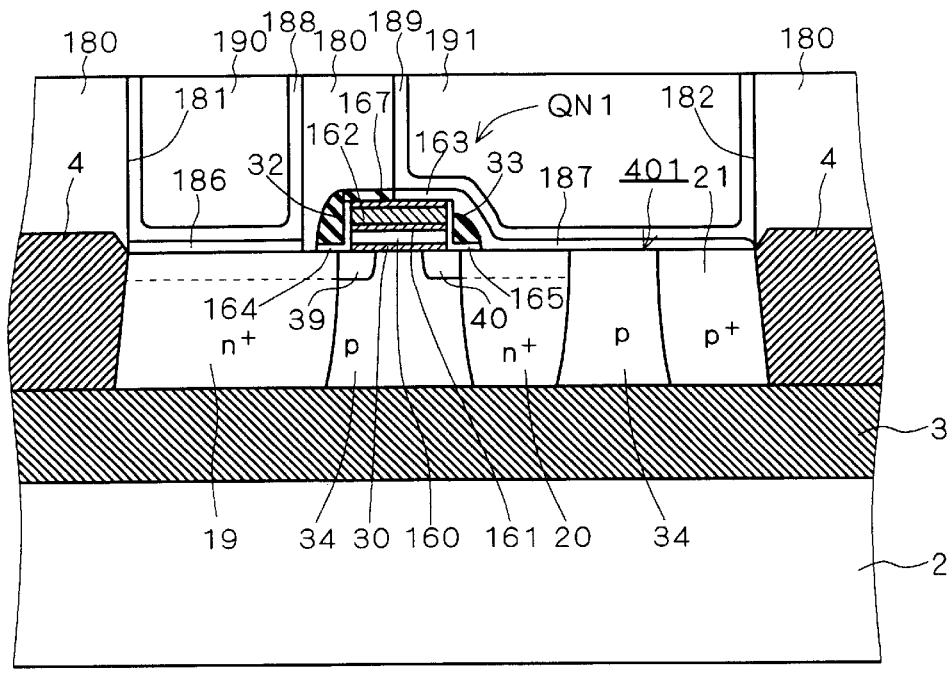
FIGS. 23 and 24 are process diagrams as a third example of the method of manufacturing the diode of FIG. 11.

FIGS. 20 to 22 are flow diagrams as a second example of the manufacturing method. According to this method, after the diode of FIG. 13 is formed in the element region SR4, the step of FIG. 20 is performed. In the step of FIG. 20, after an insulating layer 180 is formed on the entire surface of the diode of FIG. 13, the insulating layer 180 is patterned using anisotropic etching techniques to form trenches 181 and 182 each for the burial of a plug. At this time, the upper portions of the sidewall spacer 33 and the gate 31 are removed by etching, whereby part of the surface of the metal film 162 in the gate 31 is exposed.

With the SOI layer 401 exposed at the trenches 181 and 182 as seed crystals, silicon epitaxial layers 183 and 184 are selectively formed on the surface of the SOI layer 401. At this time, the silicon epitaxial layer 184 is formed to cover the area ranging from the SOI layer 401 to the metal film 162 of the gate 31. After that, a metal film 185 for silicidation, such as cobalt, is formed on the entire surface.

Then, heat treatment such as RTA is performed in nitrogen gas atmospheres. This causes reaction between the silicon epitaxial layers 183, 184 and the metal film 185 formed thereon, thereby forming metal silicide. Thereafter, the unreacted metal silicide film or a metal nitride film on the insulation layer 180 are removed by etching to form metal silicide films 186 and 187 on the bottom surfaces of the trenches 181 and 182, respectively (FIG. 21).

After barrier metal films 188 and 189, such as TiN, TaN, TaW, or WNx, are formed on the inner walls of the trenches 181 and 182 as shown in FIG. 22, metallic materials such as tungsten are buried to form plugs 190 and 191. This provides electrical connections among the gate 31, the p layer 34, and the $n^+$ layer 20 through the metal silicide film 187.

3-4. Third Example of Manufacturing Method

Figure 24:
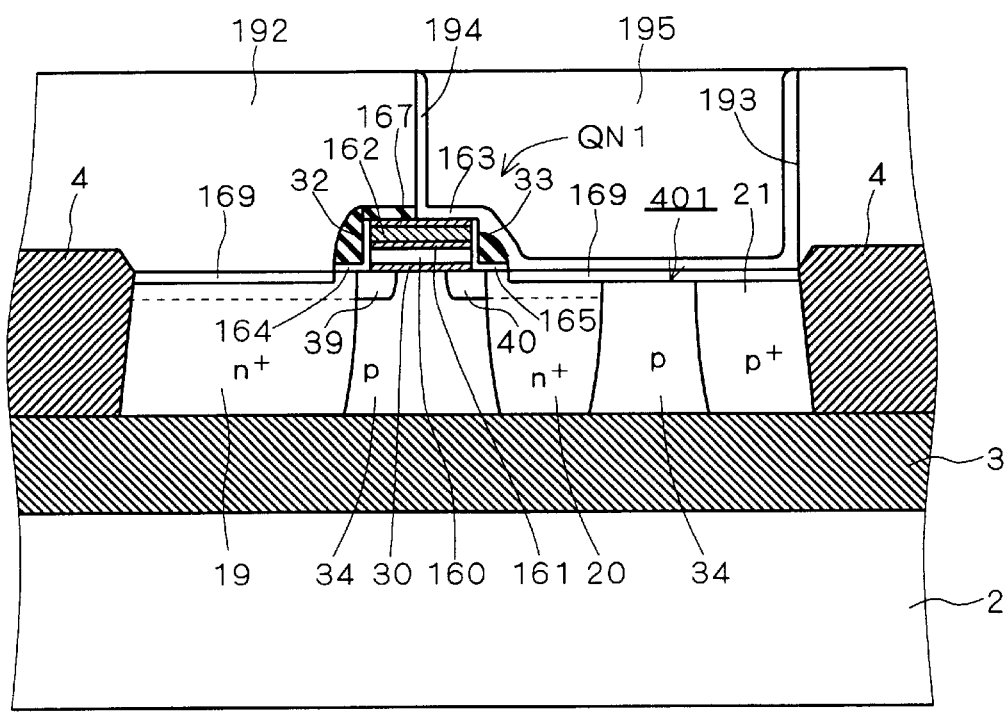

FIGS. 23 and 24 are flow diagrams as a third example of the manufacturing method. According to this method, after execution of the steps of FIGS. 13 to 15, the step of FIG. 23 is performed. In the step of FIG. 23, after an insulation film is deposited on the entire surface of the interstage structure of FIG. 15, the insulation film is patterned using anisotropic etching techniques to form a trench 193 for the burial of a plug. At this time, the upper portions of the gate 31 and the sidewall spacer 33 are removed, whereby part of the surface of the metal film 162 in the gate 31 is exposed. After a barrier metal film 194 is deposited on the entire surface and the trench 193 is filled with a metallic material, the upper surface is planarized by CMP equipment to form a plug 195 (FIG. 24). This establishes an electrical connection between the p layer 34 and the $n^+$ layer 20 through the metal silicide film 169 and further provides electrical connections between those layers and the gate 31 through the barrier metal film 194.

3-5. Example of Application to Bipolar Transistor

Figure 25:
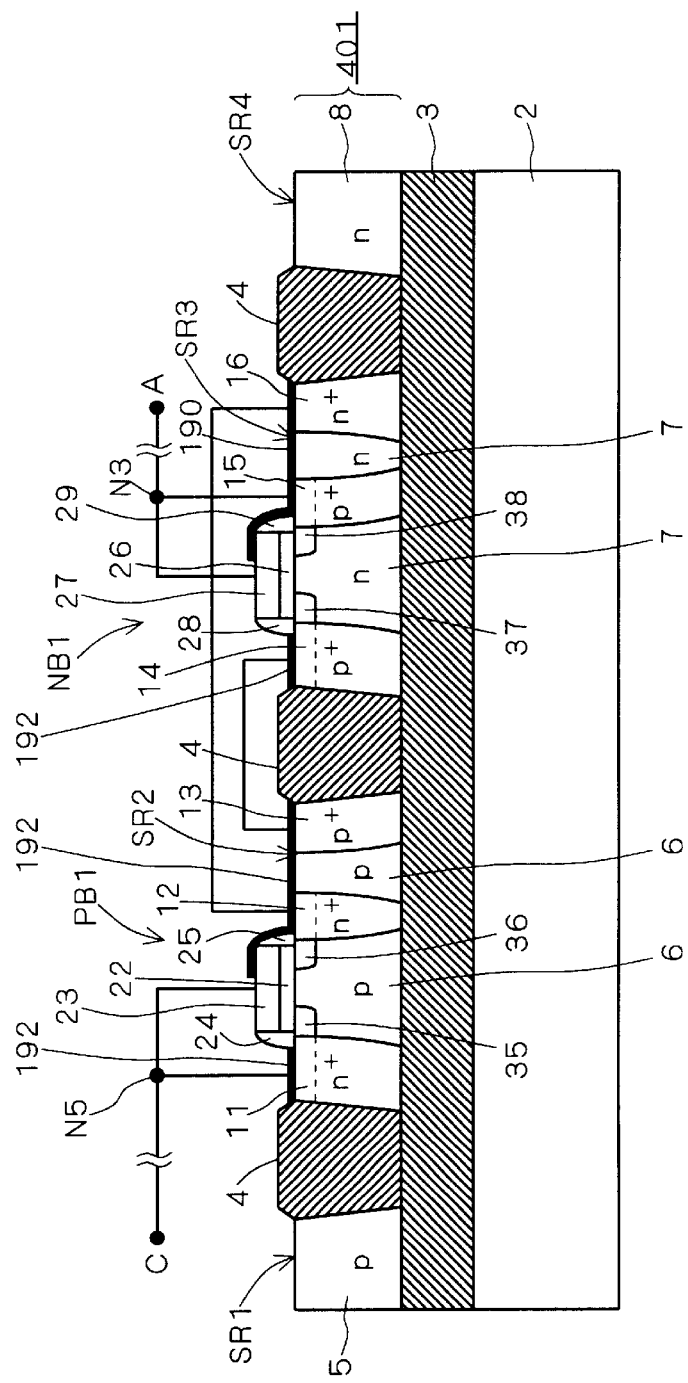
FIG. 25 is a cross-sectional view of a bipolar transistor according to the third preferred embodiment.

The aforementioned metal silicide film is also applicable to the bipolar transistors PB1 and NB1. FIG. 25 is a cross-sectional view illustrating such an example, taken along the section line X1-X2 of FIG. 1. As shown in FIG. 25, a metal silicide film 190 is formed to cover the main surface of the SOI layer 401 in the element regions SR2 and SR3, and part of the gate. That is, in either of the bipolar transistors PB1 and NB1, the gate and the source (also, the body) are electrically connected by the metal silicide film 192. The gate can thus be short-circuited with the source with low resistance and stability, which suppresses the holding voltage $V_H$ with stability.

4. Fourth Preferred Embodiment

Figure 26:
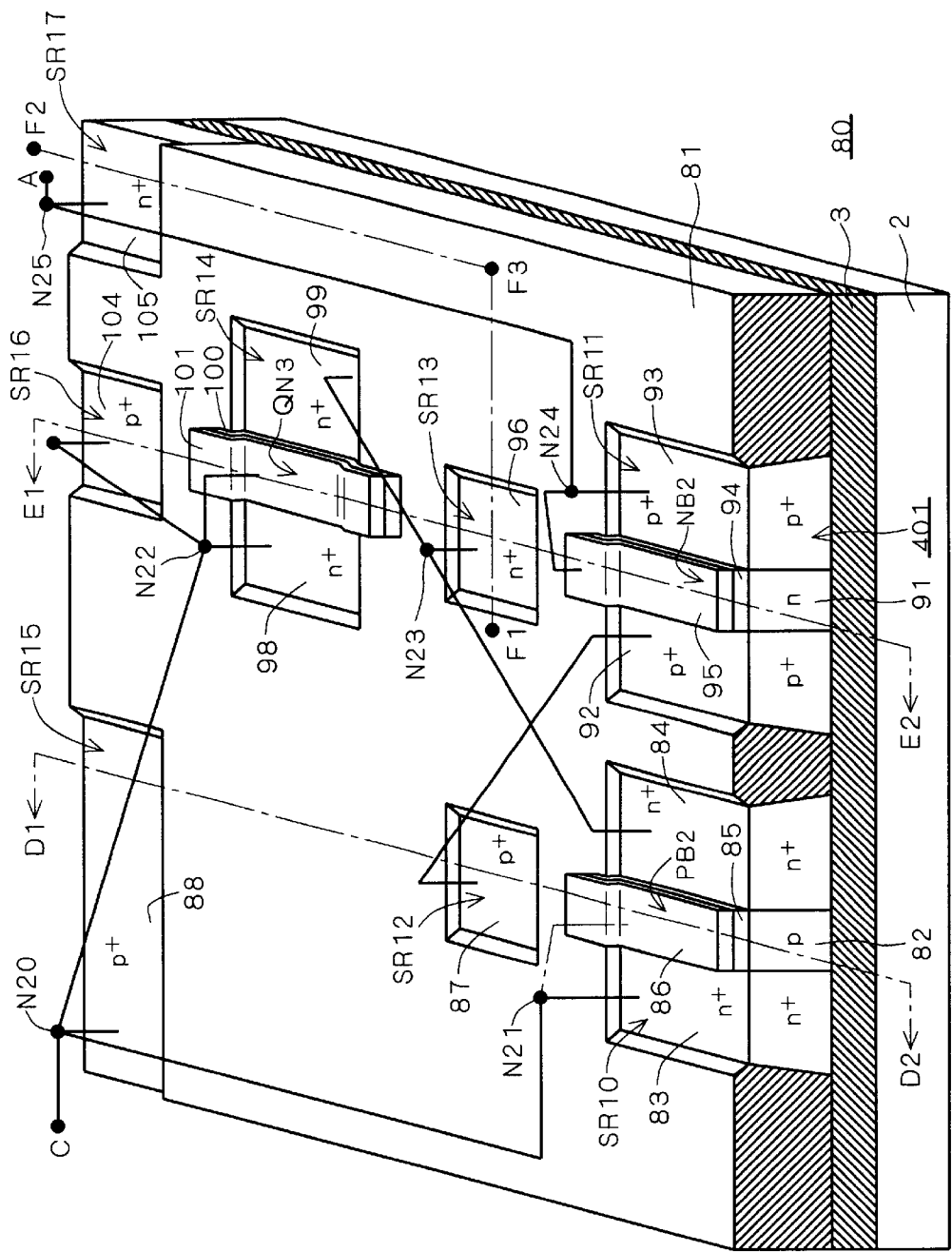
FIG. 26 is a perspective view of a semiconductor device according to a fourth preferred embodiment.
Figure 27:
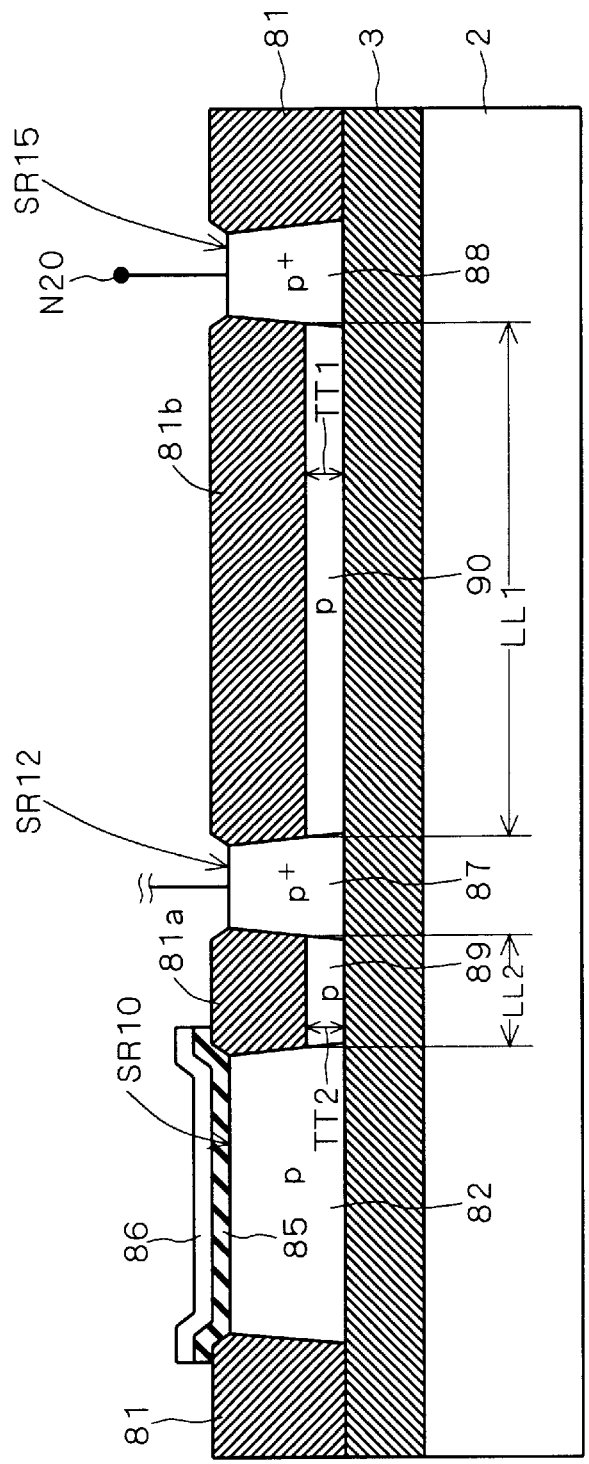
FIG. 27 is a cross-sectional view of the device of FIG. 26, taken along the section line D1-D2.
Figure 28:
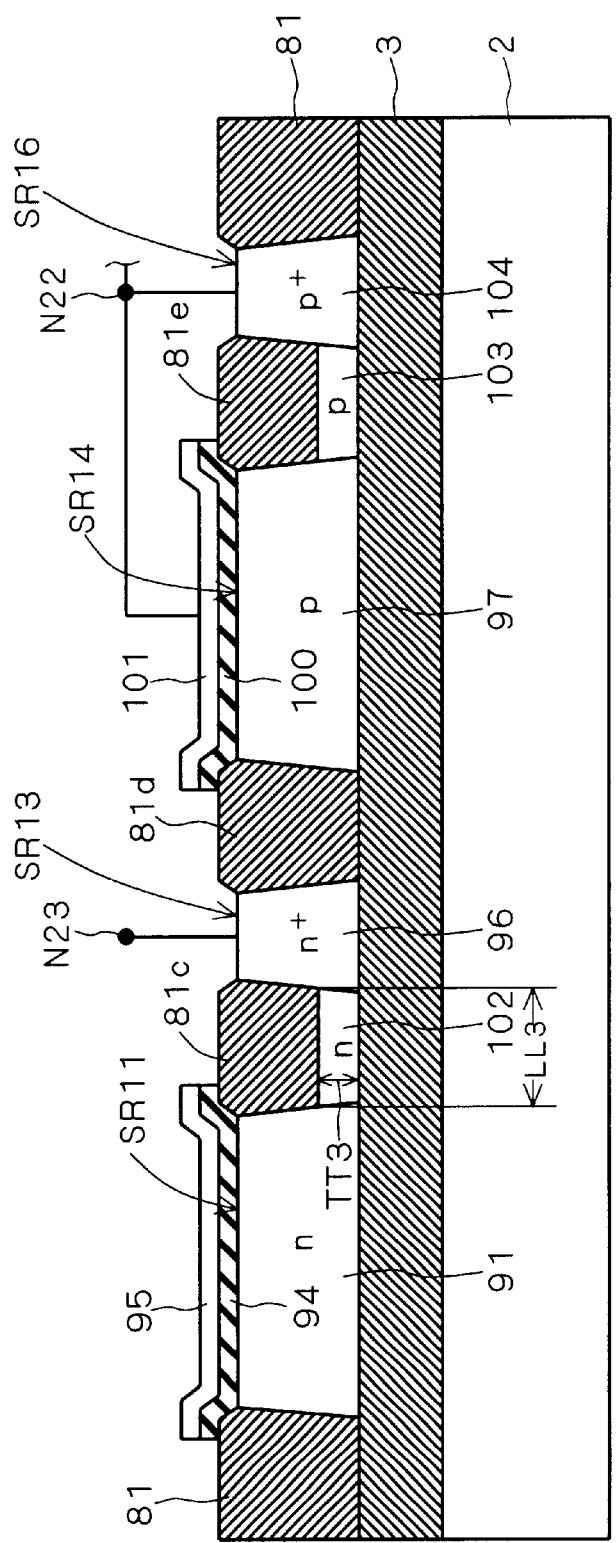
FIG. 28 is a cross-sectional view of the device of FIG. 26, taken along the section line E1-E2.
Figure 29:
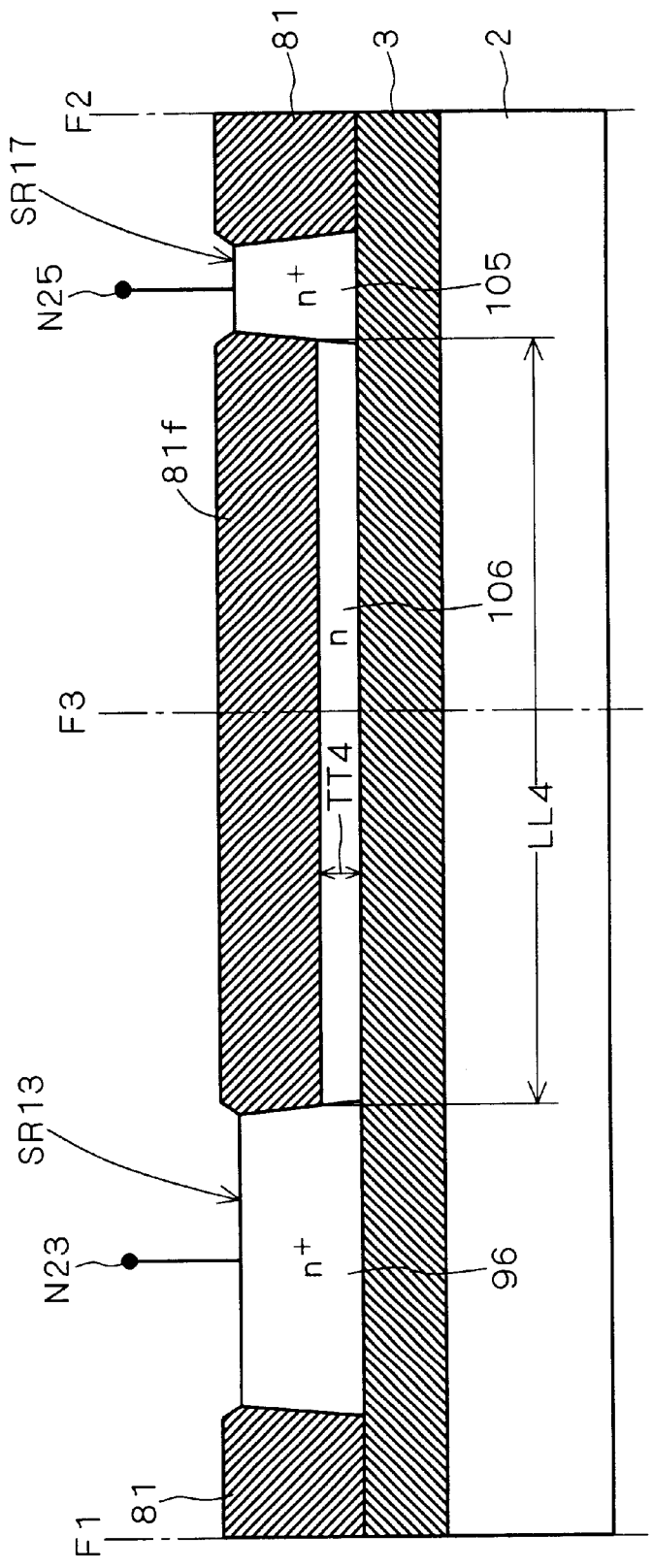
FIG. 29 is a cross-sectional view of the device of FIG. 26, taken along the section line F1-F2.

FIG. 26 is a perspective view of a semiconductor device according to a fourth preferred embodiment, when viewed angularly from the above. FIGS. 27, 28, and 29 are cross-sectional views of this semiconductor device 80 of FIG. 26, taken along the section lines D1-D2, E1-E2, and F1-F2, respectively. FIG. 30 is a circuit diagram of the semiconductor device 80. This semiconductor device 80 characteristically differs from the semiconductor device 1 of the first preferred embodiment in that some of the element regions are isolated from each other by a partial isolating layer and that resistive elements are formed in portions of the SOI layer which are sandwiched between the partial isolating layer and the buried insulation film.

In the main surface of the SOI layer 401, STI as an element isolating layer 81 is selectively formed, by which a plurality of element regions SR10 to SR17 are isolated from each other. The element isolating layer 81 has a full isolating layer which reaches the buried insulation film 3 in part of the semiconductor device 80 (including the outer periphery thereof) and a partial isolating layer which does not reach the buried insulation film 3 in other part.

A $p^+$ layer 88 is formed in the element region SR15 and a $p^+$ layer 87 in the element region SR12. These $p^+$ layers 88 and 87 are coupled through a p layer 90 which is formed in a portion of the SOI layer 4 between a partial isolating layer 81b, as part of the element isolating layer 81, and the buried insulation film 3. The p layer 90 forms a resistive element R4.

An $n^+$ layer 105 is formed in the element region SR17 and an $n^+$ layer 96 in the element region SR13. These $n^+$ layers 105 and 96 are coupled through an n layer 106 which is formed in a portion of the SOI layer 401 between a partial isolating layer 81f, as part of the element isolating layer 81, and the buried insulation film 3. The n layer 106 forms a resistive element R3.

In the element region SR10, a p layer 82 and $n^+$ layers 83, 84 are formed. The $n^+$ layer 83 forms the source of an n-channel MOSFET, and the $n^+$ layer 84 forms the drain thereof. The p layer 82 is opposed to a gate 86 with a gate insulating film 85 therebetween. The p layer 82 and the $p^+$ layer 87 is coupled through a p layer 89 which is formed in a portion of the SOI layer 401 between a partial isolating layer 81a, as part of the element isolating layer 81, and the buried insulation film 3.

The p layers 82, 89 and the $p^+$ layer 87 form the body of the n-channel MOSFET, and in particular, the $p^+$ layer 87 where a connection with wiring is made corresponds to a body contact region. Further, the p layer 89 forms a resistive element R6. That is, the body potential of the MOSFET formed in the element region SR10 is fixed through the p layer 89 corresponding to the resistive element R6.

The $n^+$ layer 83, the p layer 82 (and the p layer 89 and the $p^+$ layer 87), and the $n^+$ layer 84 form the emitter, base, and collector of an npn bipolar transistor PB2, respectively. That is, the element region SR10 (and the SR12) has formed therein the bipolar transistor PB2 as a parasitic bipolar transistor of the n-channel MOSFET.

The element region SR11 is formed to be symmetrical to the element region SR10 with respect to the conductivity type. More specifically, an n layer 91 and the $p^+$ layers 92, 93 are formed in the element region SR11. The $p^+$ layer 93 forms the source of a p-channel MOSFET, and the $p^+$ layer 92 forms the drain thereof. The n layer 91 is opposed to a gate 95 with a gate insulating film 94 therebetween. The n layer 91 and the $n^+$ layer 96 are coupled through an n layer 102 which is formed in a portion of the SOI layer 401 between a partial isolating layer 81c, as part of the element isolating layer 81, and the buried insulation film 3.

The n layers 91, 102 and the $n^+$ layer 96 form the body of the p-channel MOSFET, and in particular, the $n^+$ layer 96 where a connection with wiring is made corresponds to a body contact region. Further, the n layer 102 forms a resistive element R5. That is, the body potential of the MOSFET formed in the element region SR11 is fixed through the n layer 102 corresponding to the resistive element R5.

The $p^+$ layer 93, the n layer 91 (and the n layer 102 and the $n^+$ layer 96), and the $p^+$ layer 92 form the emitter, base, and collector of a pnp bipolar transistor NB2. That is, the element region SR11 (and the SR13) has formed therein the bipolar transistor NB2 as a parasitic bipolar transistor of the p-channel MOSFET.

The base and collector of the bipolar transistor PB2 are individually connected to the collector and base of the bipolar transistor NB2 through the resistive elements R6 and R5. The bipolar transistors NB2 and PB2 thus constitute a positive feedback circuit. In FIGS. 26 to 30, nodes N20 to N25 represent connections in the wiring.

The emitter and base of the bipolar transistor PB2 are connected with each other through the wiring and the resistive elements R4, R6, while the emitter and base of the bipolar transistor NB2 are connected with each other through the wiring and the resistive element R3 and R5. Further, the gate 86 is connected to the n+ layer 83 as the source through the wiring, while the gate 95 is connected to the p+ layer 93 as the source through the wiring. One end of the resistive element R3 is connected through the wiring to the anode A, and one end of the resistive element R4 is connected through the wiring to the cathode C. That is, the bipolar transistors PB2, NB2 and the resistive elements R3 to R6 form an SCR 403.

Besides this SCR 403, the semiconductor device 80 further comprises a diode QN3. This diode QN3 is formed in the element regions SR14 and SR16. In the element region SR14, a p layer 97 and n+ layers 98, 99 are formed. The n+ layer 98 forms one side (hereinafter referred to as a "source") of the source/drain of an n-channel MOSFET, and the n+ layer 99 forms the other side (hereinafter referred to as a "drain") of the source/drain. The p layer 97 is opposed to a gate 101 with a gate insulating film 100 therebetween.

In the element region SR16, a p+ layer 104 is formed. The p layer 97 and the p+ layer 104 are coupled through a p layer 103 which is formed in a portion of the SOI layer 401 between a partial isolating layer 81e, as part of the element isolating layer 81, and the buried insulation film 3. The element regions SR13 and SR14 are fully isolated from each other by a full isolating layer 81d as part of the element isolating layer 81.

The p layers 97, 103 and the p+ layer 104 form the body of the n-channel MOSFET, and in particular, the p+ layer 104 where a connection with wiring is made corresponds to a body contact region. Further, the p layer 103 forms a resistive element R7. That is, the body potential of the MOSFET formed in the element region SR14 is fixed through the p layer 103 corresponding to the resistive element R7.

The p layers 97, 103, the p+ layer 104, the n+ layer 98, and the gate 101 are connected to one another through the wiring. That is, the n-channel MOSFET formed in the element region SR14 (and SR16) functions as a BCG diode. Thus, the diode QN3 is formed as a p/n+ type BCG diode.

The p layers 97, 103 and the p+ layer 104, serving as the anode of the diode QN3, are connected through the wiring to the emitter of the transistor PB2, while the n+ layer 99 serving as the cathode of the diode QN3 is connected through the wiring to the collector of the transistor PB2. That is, the diode QN3 is connected inversely in parallel to the transistor PB2. The semiconductor device 80 can thus achieve the same effects as obtained with the semiconductor device 1 of the first preferred embodiment.

Since the resistive elements R3 and R4 are formed in the portions of the SOI layer 401 which are sandwiched between the partial isolating layers 81b, 81f and the buried insulation film 3, resistance thereof can be readily set to a moderately high value. This stabilizes the operation of the SCR 403 and accelerates the turn-on operation thereof. Further, it is readily possible to adjust the resistance of the resistive elements R3 and R4 to desired values by adjusting the width (the direction perpendicular to FIG. 27), length LL1, and thickness TT1 of the p layer 90 in which the resistive element R4 is formed and impurity concentration therein, and adjusting the width (the direction perpendicular to FIG. 29), length LL4, and thickness TT4 of the n layer 106 in which the resistive element R3 is formed and impurity concentration therein. This allows precise adjustments of the holding voltage $V_H$.

The presence of the resistive elements R5 and R6 further stabilizes the operation of the SCR 403. Further, it is readily possible to adjust the resistance of the resistive elements R5 and R6 to desired values by adjusting the width (the direction perpendicular to FIG. 27), length LL2, and thickness TT2 of the p layer 89 in which the resistive element R6 is formed and impurity concentration therein, and adjusting the width (the direction perpendicular to FIG. 28), length LL3, and thickness TT3 of the n layer 102 in which the resistive element R5 is formed and impurity concentration therein. Preferably, the impurity concentration in the p layer 90 and the n layer 106 should be set lower than that in the p layer 89 and the n layer 102 so that the resistance of the resistive elements R3 and R4 becomes higher than that of the resistive elements R5 and R6. This stabilizes the operation of the SCR 403 and further accelerates the turn-on operation thereof.

5. Fifth Preferred Embodiment

A semiconductor device according to a fifth preferred embodiment characteristically differs from the semiconductor device 1 of the first preferred embodiment in that two bipolar transistors constituting an SCR are equivalently formed of semiconductor layers, which are alternately jointed in an p-n-p-n order. This characteristic brings the advantage of reducing the area of the semiconductor device in the SOI substrate.

5-1. Device Construction and Operation

Figure 31:
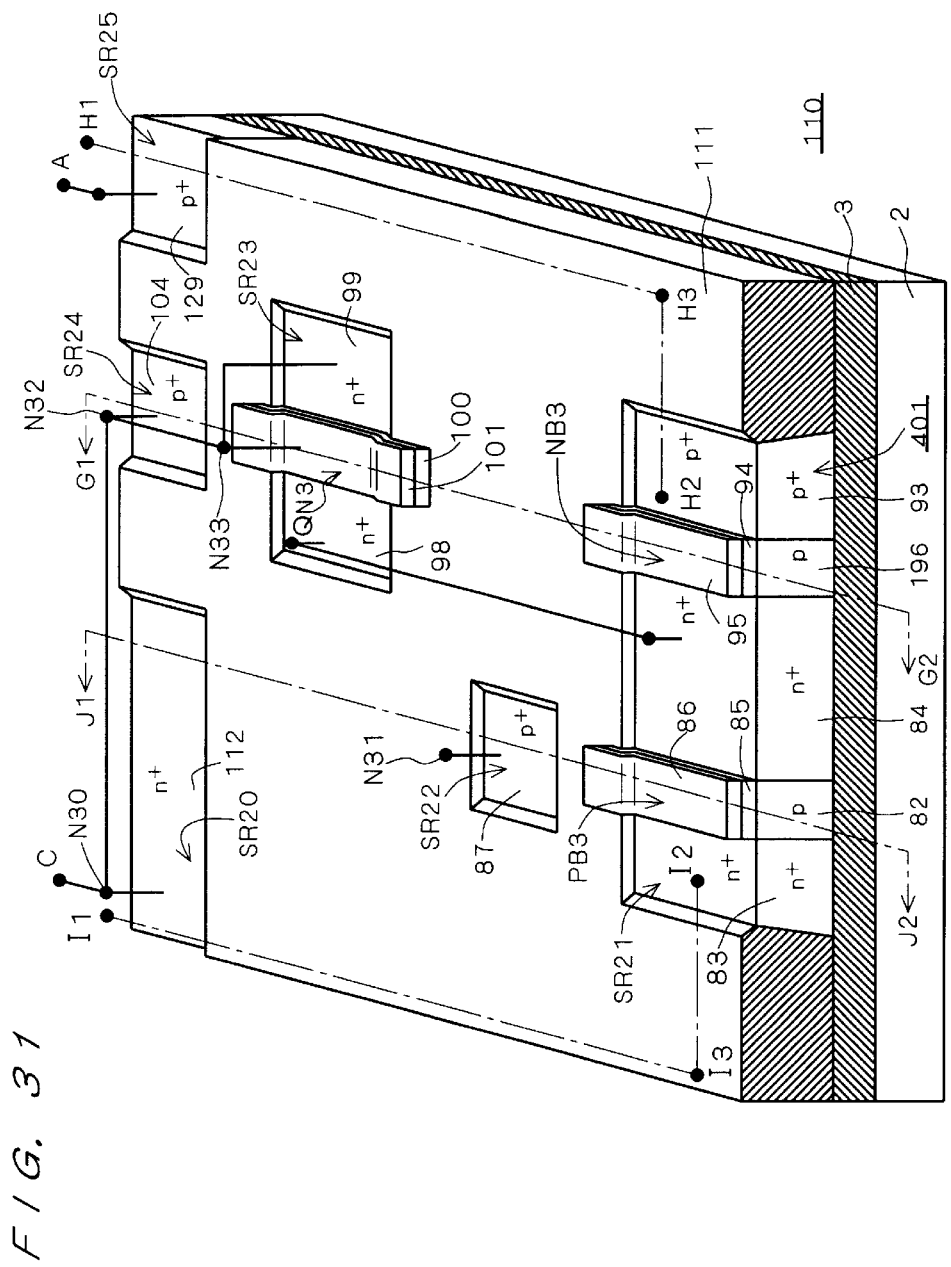
FIG. 31 is a perspective view of a semiconductor device according to a fifth preferred embodiment.
Figure 32:
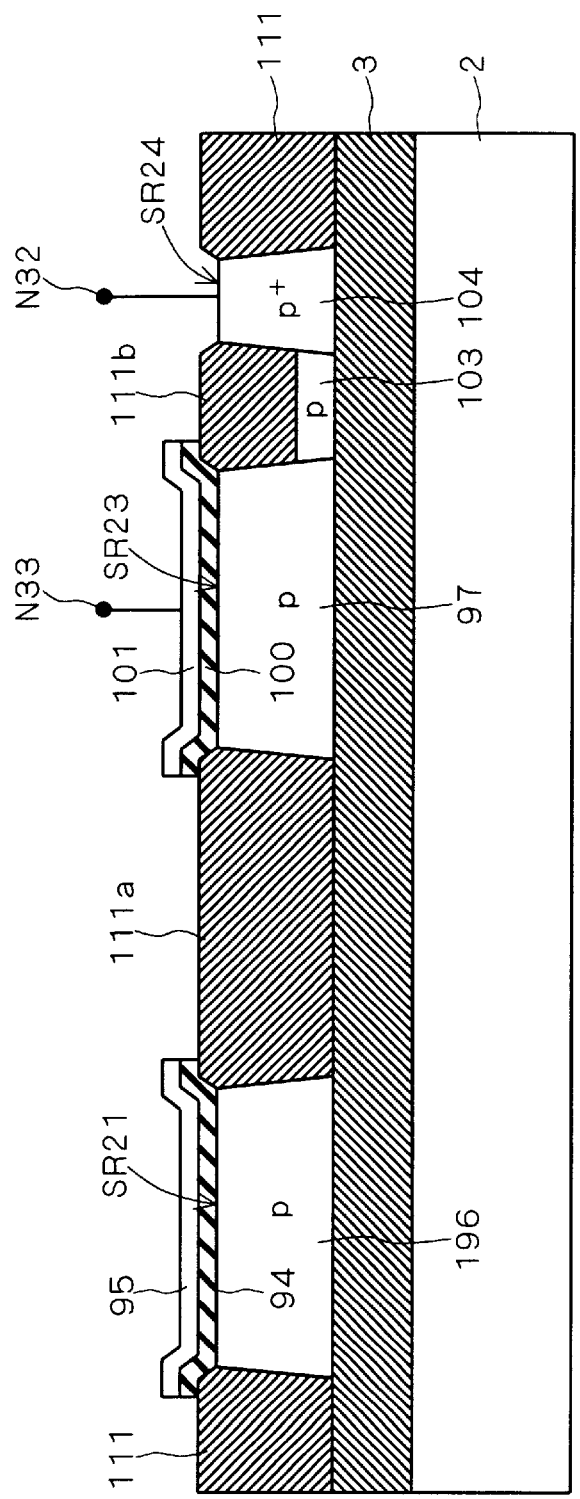
FIG. 32 is a cross-sectional view of the device of FIG. 31, taken along the section line G1-G2.
Figure 33:
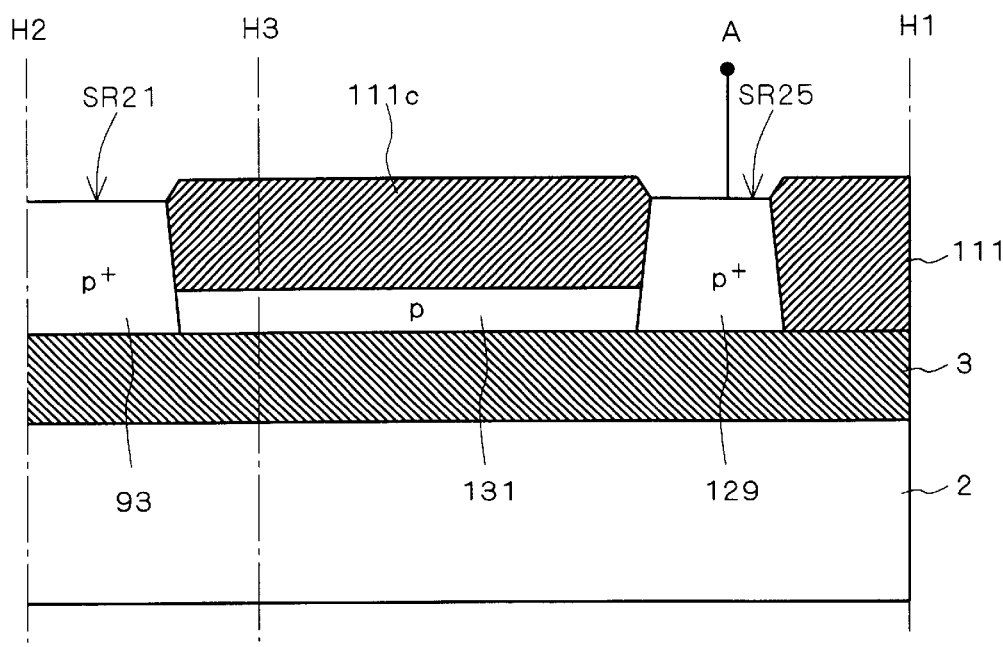
FIG. 33 is a cross-sectional view of the device of FIG. 31, taken along the section line H1-H2.
Figure 34:
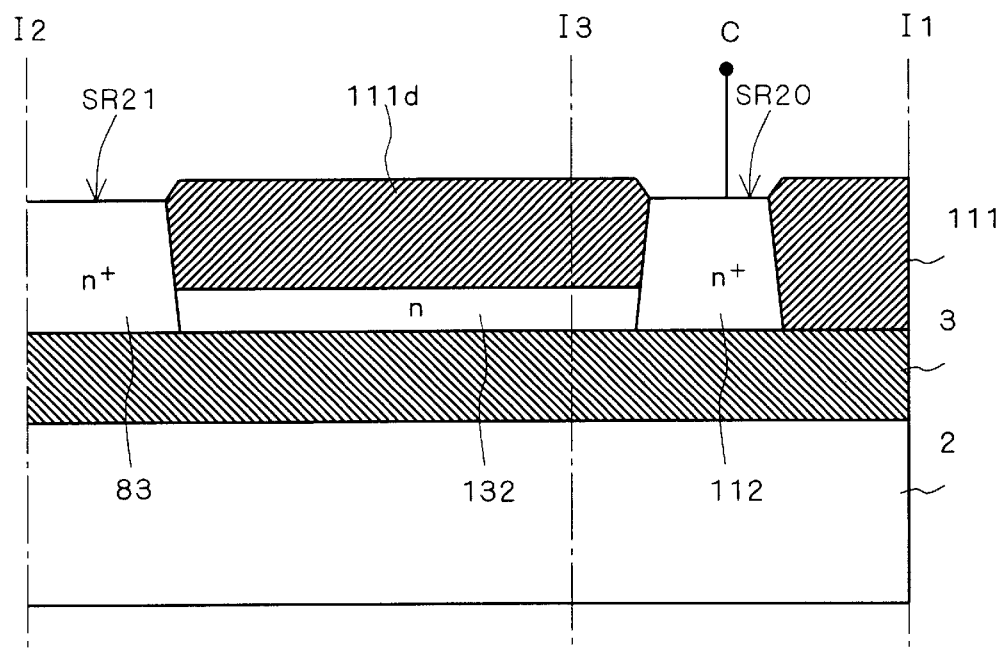
FIG. 34 is a cross-sectional view of the device of FIG. 31, taken along the section line I1-I2.
Figure 35:
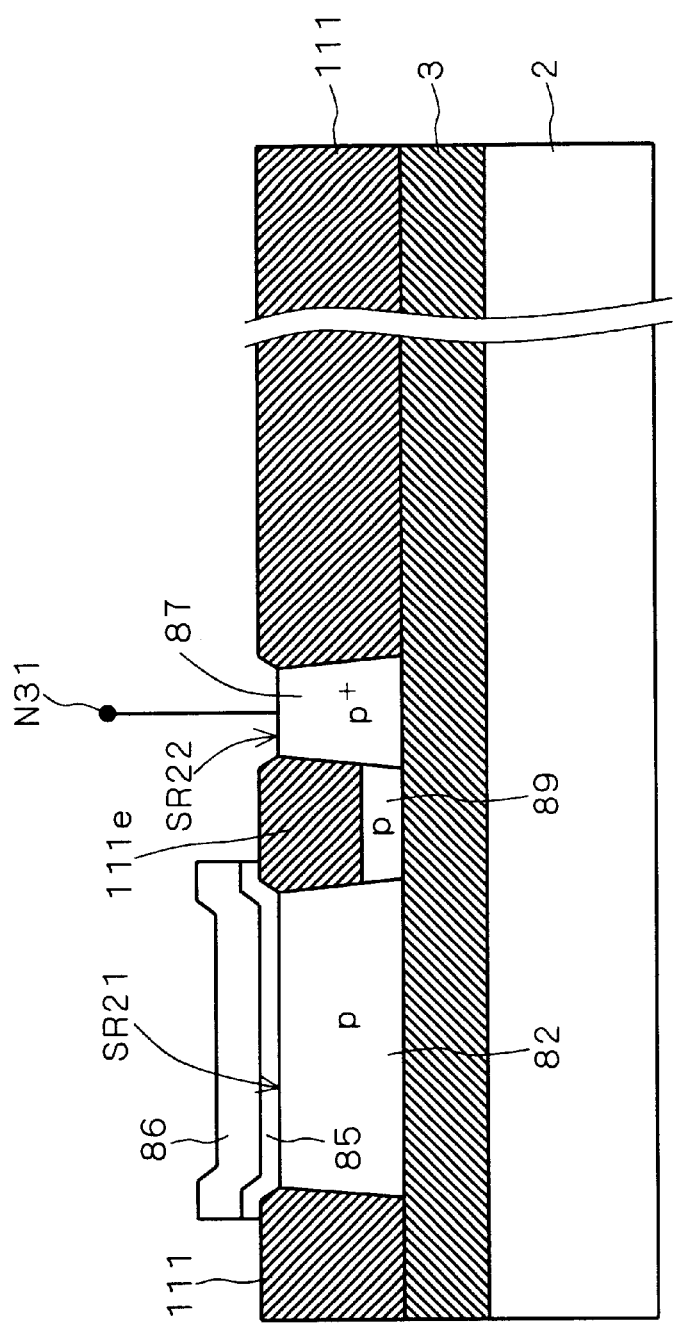
FIG. 35 is a cross-sectional view of the device of FIG. 31, taken along the section line J1-J2.

FIG. 31 is a perspective view of the semiconductor device of the fifth preferred embodiment, when viewed angularly from the above. FIGS. 32, 33, 34, and 35 are cross-sectional views of this semiconductor device 110 of FIG. 31, taken along the section lines G1-G2, H1-H2, I1-I2, and J1-J2, respectively. FIG. 36 is a circuit diagram of the semiconductor device 110. In FIGS. 31 to 36, nodes N30 to N33 represent connections in the wiring. In each MOSFET which has formed therein equivalent bipolar transistors PB3, NB3 and the diode QN3 of FIG. 31, sidewalls may be provided on the side surfaces of the gate.

In the main surface of the SOI layer 401, ST1 as an element isolating layer 111 is selectively formed, by which a plurality of element regions SR20 to SR25 are isolated from each other. The element isolating layer 111 has a full isolating layer which reaches the buried insulation film 3 in part of the semiconductor device 110 (including the outer periphery thereof) and a partial isolating layer which does not reach the buried insulation film 3 in other part.

The element region SR21 is formed by merging the elements in the element regions SR10 and SR11 of FIG. 26. More specifically, in the element region SR21, the n+ layer 83, the p layer 82, the n+ layer 84, the p layer 196, and the p+ layer 93 are coupled in this order. The n+ layer 83, the p layer 82, and the n+ layer 84 correspond to the emitter, base, and collector of an npn bipolar transistor PB3. The p layer 82, the n+ layer 84, and the p layer 196 (and the p+ layer 93) correspond to the collector, base, and emitter of a pnp bipolar transistor NB3.

That is, in the semiconductor device 110, the base of the bipolar transistor PB3 is integrated with the collector of the bipolar transistor NB3, and the collector of the bipolar transistor PB3 is integrated with the base of the bipolar transistor NB3. This reduces the area of an SCR 404 in the SOI substrate. Further, the use of the gates 86 and 95 as shields for selective introduction of impurity elements brings the advantage of forming the n⁺ layers 83, 84 and the p⁺ layer 93 in a self-aligned manner.

In the element region SR20, an n⁺ layer 112 is formed. The n⁺ layer 112 in the element region SR20 and the n⁺ layer 83 in the element region SR21 are coupled through an n layer 132 which is formed in a portion of the SOI layer 401 between a partial isolating layer 111*d*, as part of the element isolating layer 111, and the buried insulation film 3. The n layer 132 forms a resistive element R9, one end of which is connected to the cathode C through the wiring.

In the element region SR25, a p⁺ layer 129 is formed. The p⁺ layer 129 in the element region SR25 and the p⁺ layer 93 in the element region SR21 are coupled through a p layer 131 which is formed in a portion of the SOI layer 401 between a partial isolating layer 111*c*, as part of the element isolating layer 111, and the buried insulation film 3. The p layer 131 forms a resistive element R8, one end of which is connected to the anode A through the wiring.

In the element regions SR23 and SR24, the diode QN3 is formed as in the element regions SR14 and SR16 (FIG. 26). The element regions SR23 and SR21 are fully isolated from each other by a full isolating layer 111*a* as part of the element isolating layer 111.

The n⁺ layer 98 corresponding to the cathode of the diode QN3 is connected through the wiring to the n⁺ layer 84 in the element region SR21, and the p⁺ layer 104 corresponding to the anode of the diode QN3 is connected through the wiring to the n⁺ layer 112 in the element region SR20. That is, the diode QN3 is connected inversely in parallel to the bipolar transistor PB3 through the resistive element R9. The semiconductor device 110 can thus achieve the same effect as obtained with the semiconductor device 1 of the first preferred embodiment.

In the element region SR22, the p⁺ layer 87 is formed as in the element region SR12 (FIG. 26). The p layer 82 and the p⁺ layer 87 are coupled through the p layer 89 which is formed in a portion of the SOI layer 401 between a partial isolating layer 111*e*, as part of the element isolating layer 111, and the buried insulation film 3. The node N31 connected to the p⁺ layer 87 may be in a floating state and any potential may be applied thereto through the wiring. For example, it is also possible to reduce the holding voltage $V_H$ by applying potential to the node N31 thereby to pass positive base current through the p layer 82.

Since the resistive elements R8 and R9 are formed in the p layer 131 and the n layer 132 sandwiched between the buried insulation film 3 and the partial isolating layers 111*c*, 111*d*, the resistance of the resistive elements R8 and R9 can be readily set to desired values by adjusting the widths and lengths of the p layer 90 and the n layer 106 and impurity concentration therein. This allows precise adjustments of the holding voltage $V_H$.

5-2. Modifications to Semiconductor Device 110

Figure 37:
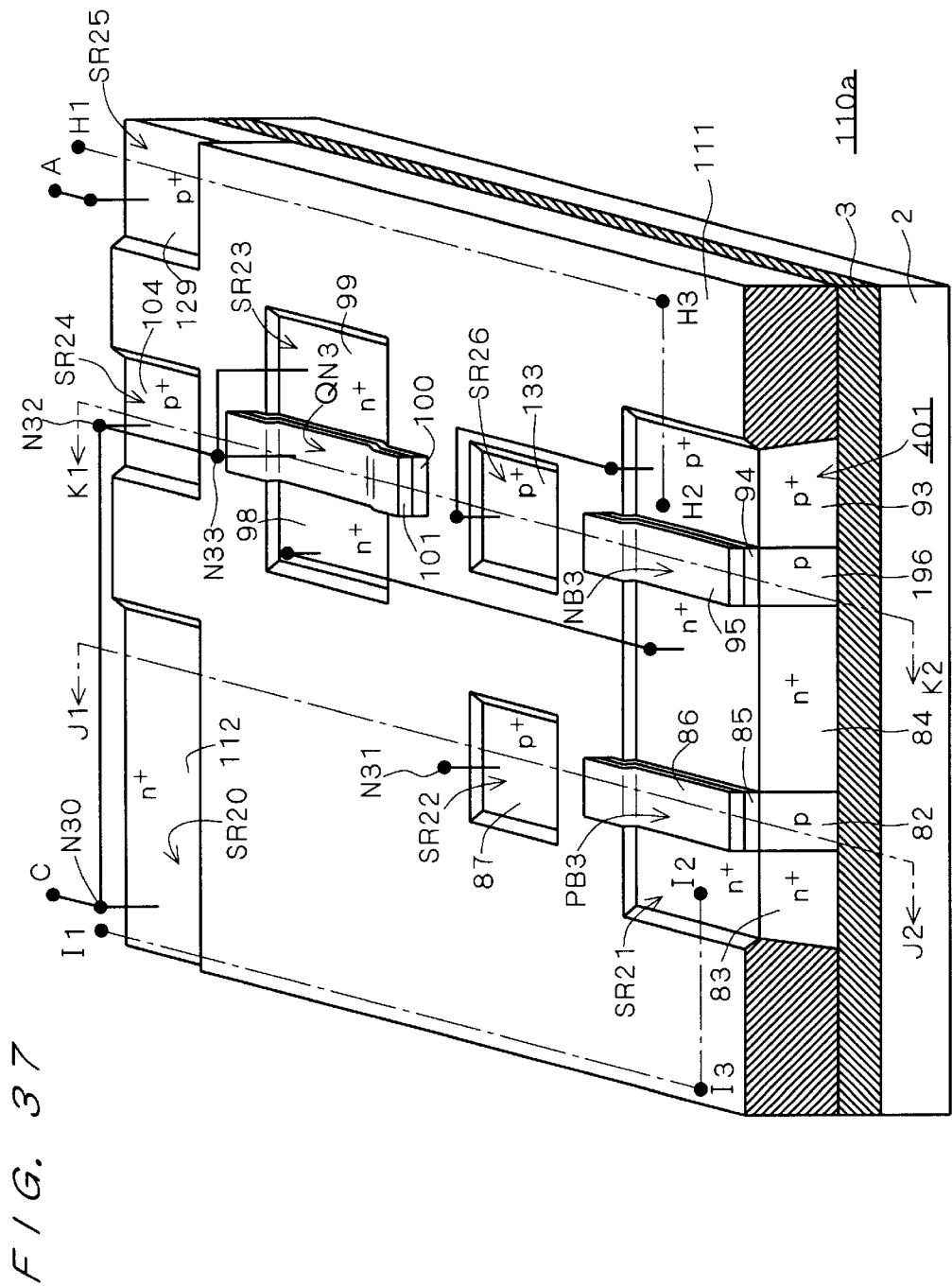
FIG. 37 is a perspective view of another device according to the fifth preferred embodiment.
Figure 38:
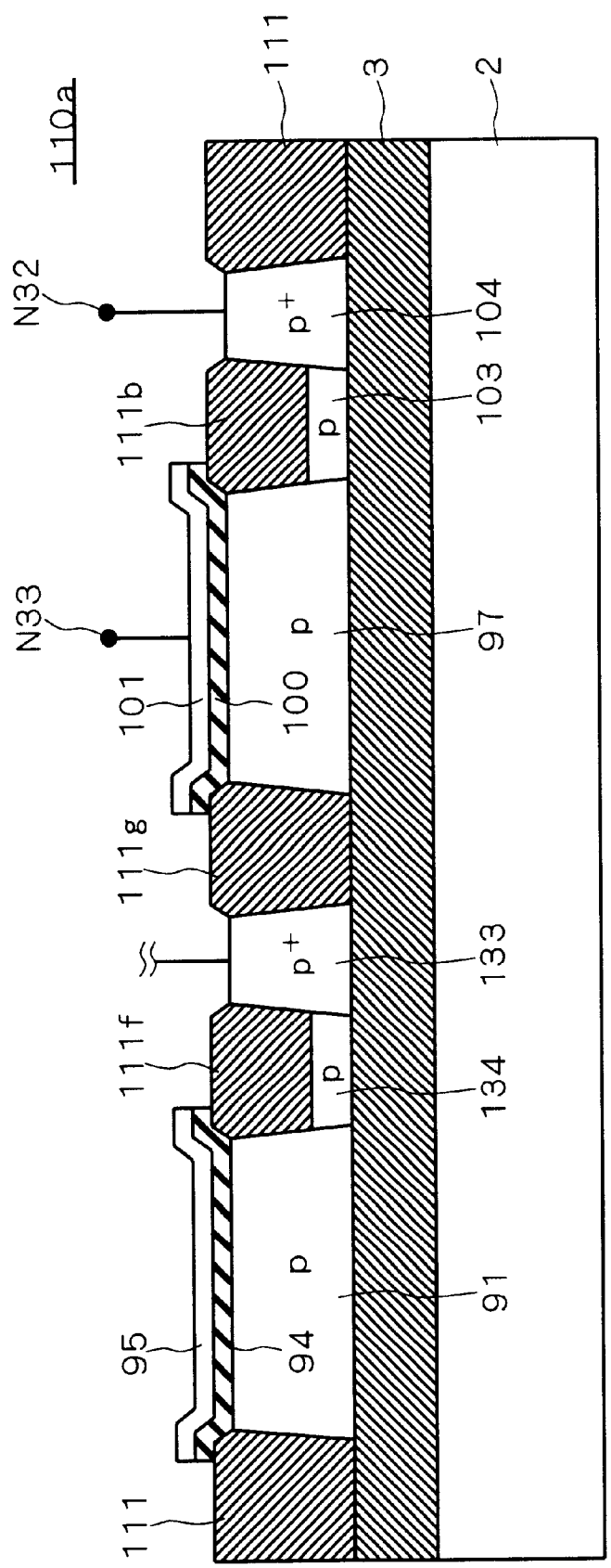
FIG. 38 is a cross-sectional view of the device of FIG. 37, taken along the section line K1-K2.

FIG. 37 is a general perspective view of a semiconductor device as a modification to the fifth preferred embodiment. FIG. 38 is a cross-sectional view of this semiconductor device 110*a* of FIG. 37, taken along the section line K1-K2. The semiconductor device 110*a* has an element region SR26 in which a p⁺ layer 133 is formed. The element region SR26 is fully isolated from the element region SR23 by a full isolating layer 111*g* as part of the element isolating layer 111 and is partially isolated from the element region SR21 by a partial isolating layer 111*f* as part of the element isolating layer 111.

The p⁺ layer 133 in the element region SR26 and the p layer 196 in the element region SR21 are coupled through a p layer 134 which is formed in a portion of the SOI layer 401 between the partial isolating layer 111*f* and the buried insulation film 3. The p⁺ layer 133 is further connected to the p⁺ layer 93 in the element region SR21 through the wiring. In this fashion, the p layer 196 may be connected to the p⁺ layer 93 through the p layer 134 as a resistive layer.

Figure 39:
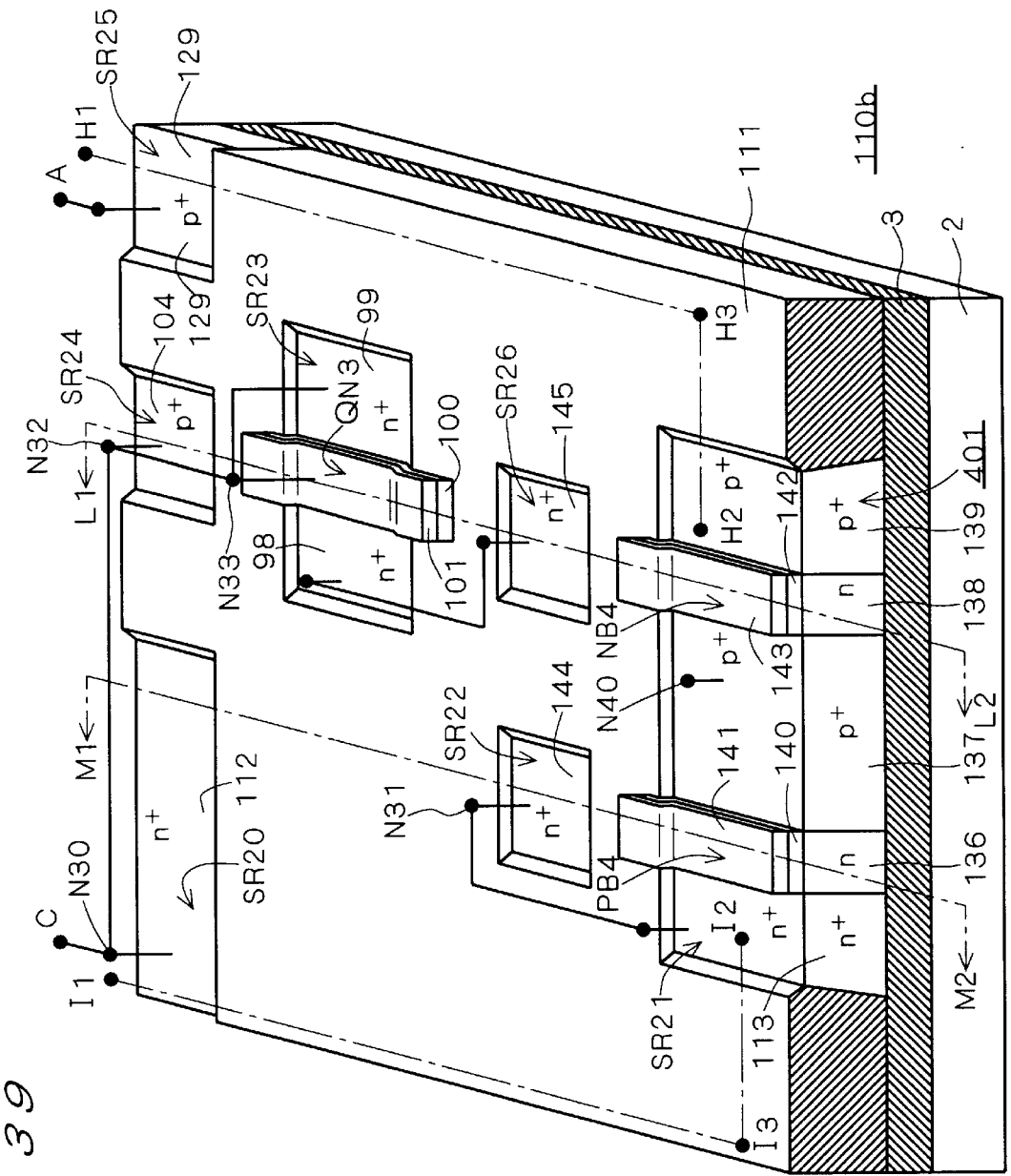
FIG. 39 is a perspective view of still another device according to the fifth preferred embodiment.
Figure 40:
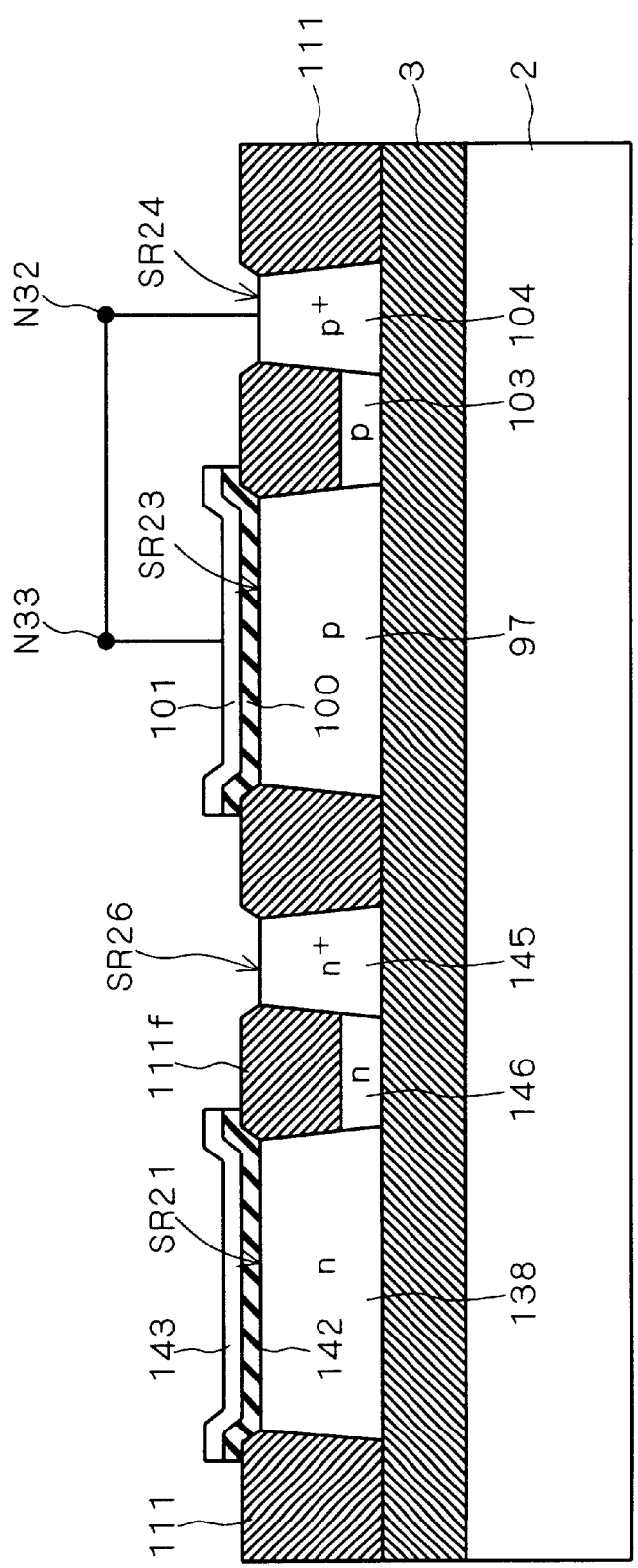
FIG. 40 is a cross-sectional view of the device of FIG. 37, taken along the section line L1-L2.
Figure 41:
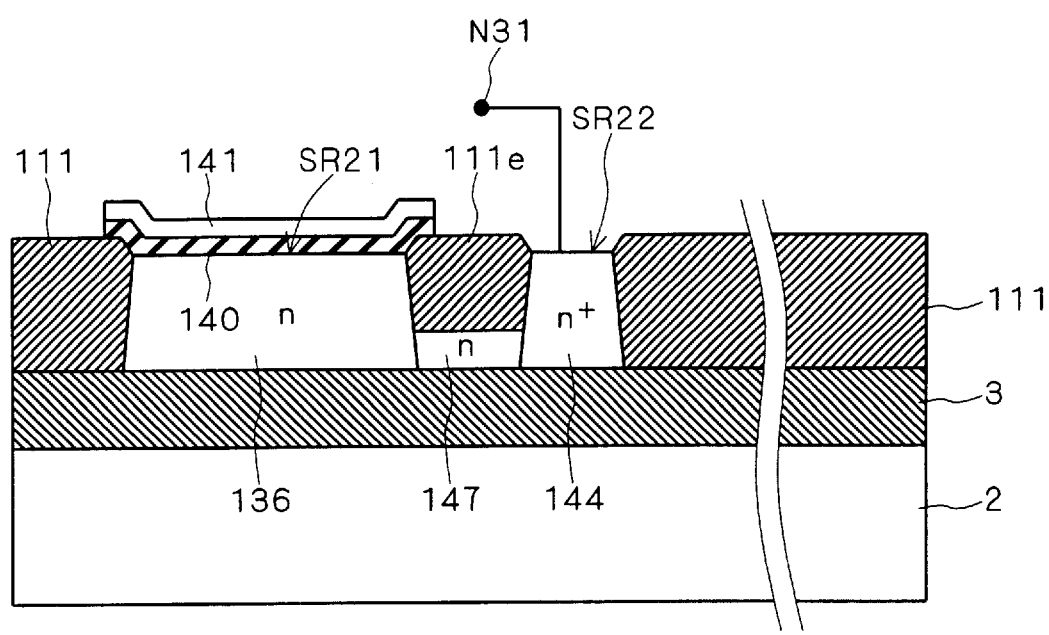
FIG. 41 is a cross-sectional view of the device of FIG. 37, taken along the section line M1-M2.

FIG. 39 is a general perspective view of a semiconductor device as another modification to the fifth preferred embodiment. FIGS. 40 and 41 are cross-sectional views of this semiconductor device 110*b* of FIG. 39, taken along the section lines L1-L2 and M1-M2, respectively.

In the element region SR21 of the semiconductor device 110*b*, an n⁺ layer 113, an n layer 136, a p⁺ layer 137, an n layer 138, and a p⁺ layer 139 are coupled in this order. The n layer 136 is opposed to a gate 141 with a gate insulating film 140 therebetween, and the n layer 138 is opposed to a gate 143 with a gate insulating film 142 therebetween.

The n⁺ layer 113 (and the n layer 136), the p⁺ layer 137, and the n layer 138 correspond to the emitter, base, and collector of an npn bipolar transistor PB4, respectively. The p⁺ layer 137, the n layer 138, and the p⁺ layer 139 correspond to the collector, base, and emitter of a pnp bipolar transistor NB4, respectively.

In the element region SR26, an n⁺ layer 145 is formed. This n⁺ layer 145 and the n layer 138 in the element region SR21 are coupled through an n layer 146 which is formed in a portion of the SOI layer 401 between the partial isolating layer 111*f* and the buried insulation film 3. The n⁺ layer 145 is further connected to the n⁺ layer 99 in the element region SR23 through the wiring.

In the element region SR22, an n⁺ layer 144 is formed. This n⁺ layer 144 and the n layer 136 in the element region SR21 are coupled through an n layer 147 which is formed in a portion of the SOI layer 401 between the partial isolating layer 111*e* and the buried insulation film 3. The n⁺ layer 144 is further connected to the n⁺ layer 113 in the element region SR21 through the wiring.

A node N40 connected to the p⁺ layer 137 may be in a floating state, and any potential may be applied thereto through the wiring. For example, it is also possible to reduce the holding voltage $V_H$ by applying potential to the node N40 thereby to pass positive base current through the p⁺ layer 137.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:

a semiconductor controlled rectifier having two bipolar transistors of different conductivity types, one of said two bipolar transistors having its base and collector connected respectively to a collector and a base of the other of said two bipolar transistors; and a diode connected inversely in parallel to the collector and emitter of said one bipolar transistor, wherein said two bipolar transistors and said diode are formed in an SOI layer of an SOI substrate.

2. The semiconductor device according to claim 1, further comprising two resistive elements, wherein said two bipolar transistors each have its base and emitter connected with each other through one of said two resistive elements, and said two resistive elements are formed in said SOI layer of said SOI substrate.

3. The semiconductor device according to claim 2, wherein
a partial isolating layer is selectively formed in a main surface of said SOI layer, and
said two resistive elements are formed in portions of said SOI layer sandwiched between said partial isolating layer and a buried insulation film.

4. The semiconductor device according to claim 3, further comprising
other two resistive elements formed in other portions of said SOI layer sandwiched between said partial isolating layer and said buried insulation film,
wherein one of said other two resistive elements is interposed between the base of said other bipolar transistor and a connection between the collector of said one bipolar transistor and one of said two resistive elements, and the other of said other two resistive elements is interposed between the base of said one bipolar transistor and a connection between the collector of said other bipolar transistor and the other of said two resistive elements.

5. The semiconductor device according to claim 4, wherein
impurity concentration is higher in said other portions of said SOI layer than in said portions of said SOI layer so that resistance of said other two resistive elements is lower than that of said two resistive elements.

6. The semiconductor device according to claim 1, wherein
said two bipolar transistors each have its emitter being one of the source and drain of a MOSFET, its collector being the other of said source and drain of said MOSFET, and its base being the body of said MOSFET.

7. The semiconductor device according to claim 6, wherein
said two MOSFETs each have its gate connected to the source.

8. The semiconductor device according to claim 7, wherein
said two MOSFETs each have a metal-semiconductor compound film which is formed across surfaces of its gate and source to establish a connection between said gate and said source.

9. The semiconductor device according to claim 8, wherein
in each of said two MOSFETs, said metal-semiconductor compound film is also formed across a surface of said body to establish connections for said gate, said source, and said body.

10. The semiconductor device according to claim 1, wherein
said two bipolar transistors are formed of semiconductor layers, which are alternately jointed in an p-n-p-n order, to be equivalent in configuration.

11. The semiconductor device according to claim 1, wherein
said diode is a BCG diode or a MOSFET whose gate and body are connected to one side of the source and the drain.

12. The semiconductor device according to claim 11, wherein
said BCG diode has a metal-semiconductor compound film which is formed across a surface of said one side and a surface of a portion of said body which is not covered with said gate, to establish a connection between said one side and said body.

13. The semiconductor device according to claim 12, wherein
in said BCG diode, said metal-semiconductor compound film is also formed across a surface of said gate to establish a connection to said gate.

* * * * *